(12) United States Patent
Nugent

(10) Patent No.: US 8,311,958 B2
(45) Date of Patent: *Nov. 13, 2012

(54) HIERARCHICAL TEMPORAL MEMORY METHODS AND SYSTEMS

(75) Inventor: Alex Nugent, Santa Fe, NM (US)

(73) Assignee: Knowm Tech, LLC, Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/269,119

(22) Filed: Oct. 7, 2011

(65) Prior Publication Data

US 2012/0078827 A1     Mar. 29, 2012

Related U.S. Application Data

(63) Continuation of application No. 13/029,374, filed on Feb. 17, 2011, now Pat. No. 8,041,653, which is a continuation of application No. 11/966,479, filed on Dec. 28, 2007, now Pat. No. 7,930,257.

(60) Provisional application No. 60/878,928, filed on Jan. 5, 2007.

(51) Int. Cl.
  *G06F 15/18* (2006.01)
(52) U.S. Cl. .......................................... 706/12
(58) Field of Classification Search .................. None
  See application file for complete search history.

(56) References Cited

U.S. PATENT DOCUMENTS

| | | | |
|---|---|---|---|
| 2,707,223 A | 4/1955 | Hollmann | |
| 3,222,654 A | 12/1965 | Widrow | |
| 3,833,894 A | 9/1974 | Aviram et al. | |
| 4,802,951 A | 2/1989 | Clark et al. | |
| 4,926,064 A | 5/1990 | Tapang | |
| 4,974,146 A | 11/1990 | Works et al. | |
| 4,988,891 A | 1/1991 | Mashiko | |
| 5,133,021 A * | 7/1992 | Carpenter et al. | 382/156 |
| 5,293,457 A | 3/1994 | Arima et al. | |
| 5,315,162 A | 5/1994 | McHardy et al. | |
| 5,422,983 A | 6/1995 | Castelaz et al. | |
| 5,475,794 A | 12/1995 | Mashiko | |
| 5,589,692 A | 12/1996 | Reed | |
| 5,649,063 A | 7/1997 | Bose | |
| 5,670,818 A | 9/1997 | Forouhi et al. | |

(Continued)

FOREIGN PATENT DOCUMENTS

EP      1 022 764 A1    7/2000

(Continued)

OTHER PUBLICATIONS

Adams et al. "Human Management of a Hierarchical Control System for Multiple Mobile Agents", IEEE ICSMC, 1994, pp. 6.*

(Continued)

*Primary Examiner* — Alan Chen
*Assistant Examiner* — Li-Wu Chang
(74) *Attorney, Agent, or Firm* — Kermit D. Lopez; Luis M. Ortiz; Ortiz & Lopez, PLLC

(57) ABSTRACT

Methods and systems for constructing biological-scale hierarchically structured cortical statistical memory systems utilizing fabrication technology and meta-stable switching devices. Learning content-addressable memory and statistical random access memory circuits are detailed. Additionally, local and global signal modulation of bottom-up and top-down processing for the initiation and direction of behavior is disclosed.

20 Claims, 19 Drawing Sheets

U.S. PATENT DOCUMENTS

| | | | |
|---|---|---|---|
| 5,706,404 | A | 1/1998 | Colak |
| 5,717,832 | A | 2/1998 | Steimle et al. |
| 5,761,115 | A | 6/1998 | Kozicki et al. |
| 5,783,840 | A | 7/1998 | Randall et al. |
| 5,812,993 | A | 9/1998 | Ginosar et al. |
| 5,896,312 | A | 4/1999 | Kozicki et al. |
| 5,904,545 | A | 5/1999 | Smith et al. |
| 5,914,893 | A | 6/1999 | Kozicki et al. |
| 5,951,881 | A | 9/1999 | Rogers et al. |
| 5,978,782 | A | 11/1999 | Neely |
| 6,026,358 | A | 2/2000 | Tomabechi |
| 6,084,796 | A | 7/2000 | Kozicki et al. |
| 6,128,214 | A | 10/2000 | Kuekes et al. |
| 6,154,815 | A * | 11/2000 | Hetherington et al. ........ 711/140 |
| 6,245,630 | B1 | 6/2001 | Ishikawa |
| 6,248,529 | B1 | 6/2001 | Connolly |
| 6,256,767 | B1 | 7/2001 | Kuekes et al. |
| 6,282,530 | B1 | 8/2001 | Huang |
| 6,294,450 | B1 | 9/2001 | Chen et al. |
| 6,314,019 | B1 | 11/2001 | Kuekes et al. |
| 6,330,553 | B1 | 12/2001 | Uchikawa et al. |
| 6,335,291 | B1 | 1/2002 | Freeman |
| 6,339,227 | B1 | 1/2002 | Ellenbogen |
| 6,359,288 | B1 | 3/2002 | Ying et al. |
| 6,363,369 | B1 | 3/2002 | Liaw et al. |
| 6,383,923 | B1 | 5/2002 | Brown et al. |
| 6,389,404 | B1 | 5/2002 | Carson et al. |
| 6,407,443 | B2 | 6/2002 | Chen et al. |
| 6,418,423 | B1 | 7/2002 | Kambhatla et al. |
| 6,420,092 | B1 | 7/2002 | Yang et al. |
| 6,422,450 | B1 | 7/2002 | Zhou et al. |
| 6,423,583 | B1 | 7/2002 | Avouris et al. |
| 6,424,961 | B1 | 7/2002 | Ayala |
| 6,426,134 | B1 | 7/2002 | Lavin et al. |
| 6,536,106 | B1 | 3/2003 | Jackson et al. |
| 6,620,346 | B1 | 9/2003 | Schulz et al. |
| 6,798,692 | B2 | 9/2004 | Kozicki et al. |
| 6,855,329 | B1 | 2/2005 | Shakesheff et al. |
| 6,889,216 | B2 | 5/2005 | Nugent |
| 6,995,649 | B2 | 2/2006 | Nugent |
| 7,028,017 | B2 | 4/2006 | Nugent |
| 7,039,619 | B2 | 5/2006 | Nugent |
| 7,107,252 | B2 | 9/2006 | Nugent |
| 2001/0004471 | A1 | 6/2001 | Zhang |
| 2001/0023986 | A1 | 9/2001 | Mancevski |
| 2001/0024633 | A1 | 9/2001 | Lee et al. |
| 2001/0031900 | A1 | 10/2001 | Margrave et al. |
| 2001/0041160 | A1 | 11/2001 | Margrave et al. |
| 2001/0044114 | A1 | 11/2001 | Connolly |
| 2002/0001905 | A1 | 1/2002 | Choi et al. |
| 2002/0004028 | A1 | 1/2002 | Margrave et al. |
| 2002/0004136 | A1 | 1/2002 | Gao et al. |
| 2002/0030205 | A1 | 3/2002 | Varshavsky |
| 2002/0075126 | A1 | 6/2002 | Reitz et al. |
| 2002/0086124 | A1 | 7/2002 | Margrave et al. |
| 2002/0090468 | A1 | 7/2002 | Goto et al. |
| 2002/0102353 | A1 | 8/2002 | Mauthner et al. |
| 2003/0031438 | A1 | 2/2003 | Kambe et al. |
| 2003/0067013 | A1 | 4/2003 | Ichibara et al. |
| 2003/0177450 | A1 | 9/2003 | Nugent |
| 2003/0236760 | A1 | 12/2003 | Nugent |
| 2004/0039717 | A1 | 2/2004 | Nugent |
| 2004/0150010 | A1 | 8/2004 | Snider |
| 2004/0153426 | A1 | 8/2004 | Nugent |
| 2004/0162796 | A1 | 8/2004 | Nugent |
| 2004/0193558 | A1 | 9/2004 | Nugent |
| 2006/0184466 | A1 | 8/2006 | Nugent |
| 2006/0282186 | A1 | 12/2006 | Hansen et al. |
| 2007/0005531 | A1 | 1/2007 | George et al. |
| 2007/0192267 | A1 | 8/2007 | Hawkins et al. |

FOREIGN PATENT DOCUMENTS

| | | |
|---|---|---|
| EP | 1 046 613 A1 | 10/2000 |
| EP | 1 069 206 A2 | 1/2001 |
| EP | 0 989 579 A3 | 3/2001 |
| EP | 1 100 106 A2 | 5/2001 |
| EP | 1 115 135 A1 | 7/2001 |
| EP | 1 134 304 A2 | 9/2001 |
| RU | 2071126 C1 | 12/1996 |
| WO | WO 00/44094 A1 | 7/2000 |
| WO | WO 03/017282 A1 | 2/2003 |

OTHER PUBLICATIONS

Weeks et al., "High-pressure nanolithography using low-energy electrons from a scanning tunneling microscope," Institute of Physics Publishing, Nanotechnology 13 (2002), pp. 38-42; Dec. 12, 2001.

G. Pirio, et al., "Fabrication and electrical characteristics of carbon nanotube field emission microcathodes with an integrated gate electrode," Institute of Physics Publishing, Nanotechnology 13 (2002), pp. 1-4, Oct. 2, 2001.

Derycke, V. et al., "Carbon Nanotube Inter- and Intramolecular Logic Gates," Nano Letters (2001) 1(9):453-456.

Collins et al., "Engineering Carbon Nanotubes and Nanotube Circuits Using Electrical Breakdown," Science, vol. 292, pp. 706-709, Apr. 27, 2001.

Jeong-Mi Moon et al., "High-Yield Purification Process of Singlewalled Carbon Nanotubes," J. Phys. Chem. B 2001, 105, pp. 5677-5681.

Hermanson et al., "Dielectrophoretic Assembly of Electrically Functional Microwires from Nanoparticle Suspensions," Materials Science, vol. 294, No. 5544. Issue of Nov. 2, 2001, pp. 1082-1086.

J. Appenzeller et al., "Optimized contact configuration for the study of transport phenomena in ropes of single-wall carbon nanotubes," Applied Physics Letters, vol. 78, No. 21, pp. 3313-3315, May 21, 2001.

Niyogi et al., "Chromatographic Purification of Soluble Single-Walled Carbon Nanotubes (s-SWNTs),"J. Am. Chem. Soc 2001, 123, pp. 733-734, Received Jul. 10, 2000.

Duan et al., "Indium phosphide nanowires as building blocks for nanoscale electronic and optoelectronic devices," Nature, vol. 409, Jan. 4, 2001, pp. 66-69.

Paulson, et al., "Tunable Resistance of a Carbon Nanotube-Graphite Interface," Science, vol. 290, Dec. 1, 2000, pp. 1742-1744.

Wei et al., "Reliability and current carrying capacity of carbon nanotubes," Applied Physics Letters, vol. 79, No. 8, Aug. 20, 2001, pp. 1172-1174.

Collins et al., "Nanotubes for Electronics," Scientific American, Dec. 2000, pp. 62-69.

Avouris et al., "Carbon nanotubes: nanomechanics, manipulation, and electronic devices," Applied Surface Science 141 (1999), pp. 201-209.

Smith et al., "Electric-field assisted assembly and alignment of metallic nanowires,"Applied Physics Letters, vol. 77, No. 9, Aug. 28, 2000, pp. 1399-1401.

Hone et al., "Electrical and thermal transport properties of magnetically aligned single wall carbon nanotube films," Applied Physics Letters, vol. 77, No. 5, Jul. 31, 2000, pp. 666-668.

Smith et al., "Structural anisotropy of magnetically aligned single wall carbon nanotube films," Applied Physics Letters, vol. 77, No. 5, Jul. 31, 2000, pp. 663-665.

Andriotis et al., "Various bonding configurations of transition-metal atoms on carbon nanotubes: Their effect on contact resistance," Applied Physics Letters, vol. 76, No. 26, Jun. 26, 2000, pp. 3890-3892.

Chen et al., "Aligning single-wall carbon nanotubes with an alternating-current electric field," Applied Physics Letters, vol. 78, No. 23, Jun. 4, 2001, pp. 3714-3716.

Bezryadin et al., "Self-assembled chains of graphitized carbon nanoparticles," Applied Physics Letters, vol. 74, No. 18, May 3, 1999, pp. 2699-2701.

Bezryadin et al., "Evolution of avalanche conducting states in electrorheological liquids," Physical Review E, vol. 59, No. 6, Jun. 1999, pp. 6896-6901.

Liu et al., "Fullerene Pipes," Science, vol. 280, May 22, 1998, pp. 1253-1255.

Yamamoto et al., "Orientation and purification of carbon nanotubes using ac electrophoresis," J. Phys. D: Appl. Phys 31 (1998) L34-L36.

Bandow et al., "Purification of Single-Wall Carbon Nanotubes by Microfiltration" J. Phys. Chem. B 1997, 101, pp. 8839-8842.

Tohji et al., "Purifying single walled nanotubes," Nature, vol. 383, Oct. 24, 1996, p. 679.

Dejan Rakovic, "Hierarchical Neural Networks and Brainwaves: Towards a Theory of Consciousness," Brain & Consciousness: Proc. ECPD Workshop (ECPD, Belgrade, 1997), pp. 189-204.

Mitchell, G., "Sub-50 nm Device Fabrication Strategies," Project No. 890-00, Cornell Nanofabrication Facility, Electronics—p. 90-91, National Nanofabrication Users Network (2002).

Saito et al., "A 1M Synapse Self-Learning Digital Neural Network Chip," ISSCC, pp. 6.5-1 to 6.5-10, IEEE 1998.

Osamu Fujita, "Statistical estimation of the number of hidden units for feedforward neural networks," Neural Networks 11 (1998), pp. 851-859.

Abraham Harte, "Liquid Crystals Allow Large-Scale Alignment of Carbon Nanotubes," CURJ (Caltech Undergraduate Research Journal), Nov. 2001, vol. 1, No. 2, pp. 44-49.

"Quantum-Dot Arrays for Computation," ORNL Review vol. 34, No. 2, 2001, pp. 1-5 http://www.ornlgov/ORNLReview/v34_2_01/arrays.htm.

"Elements of Artificial Neural Networks" K. Mehrotra, C. K. Mohan, S. Ranka, 1997, MIT Press, pp. 116-135.

"Collective Transport in Arrays of Small Metallic Dots" A. Alan Middleton, N.S. Wingreen, 1993, The American Physical Society, 0031-9007/93/71(19)/3198(4), pp. 3198 through 3201.

"Solid-State thin-film memistor for electronic neural networks", S. Thakoor, A. Moopenn, T. Daud, and A.P. Thakoor, Journal of Applied Physics—Mar. 15, 1990—vol. 67, Issue 6, pp. 3132-3135.

"Computational nanotechnology with carbon nanotubes and fullernes", Srivastava, D. Menon M. Kyeongjae Cho, NASA Ames Res. Center, Moffett Field, CA, Computing in Science & Engineering, Jul./Aug. 2001, vol. 3, Issue 4, pp. 42-55.

X. Liu, et al., "Electric-Field-Induced Accumulation and Alignment of Carbon Nanotubes," 2002 Annual Report Conference on Electrical Insulation and Dielectric Phenomena; 2002 IEEE, pp. 31-34.

O'Connor, P. et al., "CMOS Preamplifier with High Lincarity and Ultra Low Noise for X-Ray Spectroscopy," IEEE Transactions on Nuclear Science, Jun. 3, 1997, vol. 44, Issue 3, pp. 318-325.

Snow, E. S., et al., "Nanofabrication with Proximal Probes," Proceedings of the IEEE, Apr. 1997, vol. 85, No. 4, pp. 601-611.

Girolami et al., "A Temporal Model of Linear Anti-Hebbian," Learning Neural Processing Letters 4. 1996, pp. 139-148.

Baratta et al., "A Hardware Implementation of Hierarchical Neural Networks for Real-Time Quality Control Systems in Industrial Applications" ICANN, 1997, vol. 1327, pp. 1229-1234.

Christopher Johansson & Anders Lansner, "Towards Cortex Sized Artificial Nervous System", Department of Numerical Analysis and Computer Science, Royal Institute of Technology, Stockholm Sweden, Jan. 2007, 8 pages.

Peter Weiss, "Circuitry in a Nanowire: Novel Growth Method May Transform Chips," Science News Online, vol. 161, No. 6; Feb. 9, 2002, 4 pages.

Press Release, "Nanowire-based electronics and optics comes one step closer," Eureka Alert, American Chemical Society; Feb. 1, 2002, 2 pages.

CMP Cientifica, "Nanotech: the tiny revolution"; CMP Cientifica, Nov. 2001, pp. 1-30.

Diehl, et al., "Self-Assembled, Deterministic Carbon Nanotube Wiring Networks," Angew. Chem. Int. Ed. 2002, 41, No. 2; pp. 353-356.

Leslie Smith, "An Introdution to Neural Networks," Center for Cognitive and Computational Neuroscience, Dept. of Computing & Mathematics, University of Stirling, Oct. 25, 1996; http//www.cs.stir.ac.uk/~lss/NNIntro/InvSlides.html, 10 pages.

Mark K. Anderson, "Mega Steps Toward the Nanochip," Wired News, Apr. 27, 2001, 3 pages.

Landman et al., "Metal-Semiconductor Nanocontacts: Silicon Nanowires," Physical Review Letters (2000) 85(9):1958-1961, Aug. 28.

John G. Spooner, "Tiny tubes mean big chip advances," Cnet News.com, Tech News First, Apr. 26, 2001, 3 pages.

"A New Class of Nanostructure: Semiconducting Nanobelts Offer Potential for Nanosensors and Nanoelectronics," Mar. 12, 2001, http://www.sciencedaily.com/releases/2001/03/01309080953.htm, 3 pages.

Press Release, "Toshiba Demonstrates Operation of Single-Electron Transistor Circuit at Room Temperature," Toshiba, Jan. 10, 2001, 2 pages.

David Rotman, "Molecular Memory, Replacing silicon with organic molecules could mean tiny supercomputers," Technology Review, May 2001, p. 46.

Westervelt et al., "Molecular Electronics," NSF Functional Nanostructures Grant 9871810, NSF Partnership in Nanotechnology Conference, Jan. 29-30, 2001; http://www.unix.olt.umass.edu/~nano/NewFiles/FN19_Haryard.pdf, 3 pages.

Dave Anderson & George McNeill, "Artificial Neural Networks Technology," A DACS (Data & Analysis Center for Software) State-of-the-Art Report, Contract No. F30602-89-C-0082, ELIN: A011, Rome Laboratory RL/C3C, Griffiss Air Force Base, New York, Aug. 20, 1992, 87 pages.

Declaris, J.-W. et al., "An Introduction to Neural Networks," http://www.ee.umd.edu/medlab/neural/nn1.html, last modified Jul. 20, 1997, 4 pages.

"Neural Networks," StatSoft, Inc., http://www.statsoft.com/textbook/neural-networks/ Mar. 4, 2002, 30 pages.

Jones, S. "Neural Networks and the Computation Brain or Matters relating to Artificial Intelligence," The Brain Project, http://www.culture.com.su/brain_proj/nsur_net.htm. Mar. 4, 2002, 17 pages.

Clark, D. W., "An Introduction to Neural Networks"; http://members.home.net/neuralnet/introtonn/index.htm (1997), 6 pages.

"A Basic Introduction to Neural Networks"; http://blizzard.gis.utuc.edu/htmldocs/Neural/neural.html Feb. 15, 2002, 4 pages.

Meyer, S. A. et al., "Computational neural networks: a general purpose tool for nanotechnology," Abstract, 5th Foresight Conference on Molecular Nanotechnology; http://www.islandone.org/Foresight/Conferences/MNT05/Abstracts/Meyeabst.html Sep. 4, 1997 2 pages.

Espejo, et al., "A 16×16 Cellular Neural Network Chip for Connected Component Detection," Jun. 30, 1999; http://www.imse.cnm.csic.es/Chipcat/espejo/chip-2pdf, 3 pages.

Pati et al., "Neural Networks for Tactile Perception," Systems Research Center and Dept. of Electrical Engineering, University of Maryland and U.S Naval Research Laboratory. 1987; 17 pages. http://www.isr.umd.edu/TechReports/ISR/1987/TR_87-123/TR_87-123.phtml.

"Nanoparticles Get Wire," Sciencenow, Aug. 28, 1997, Dimes Institute, Delft University of Technology, 1 page.

Bezryadin, A. et al., "Trapping Single Particle with Nancelectrodes," Physics News Graphics, Sep. 1997, 5 pages.

* cited by examiner

HIERARCHICAL TEMPORAL MEMORY METHODS AND SYSTEMS

CROSS-REFERENCE TO RELATED APPLICATIONS

This patent application is a continuation of U.S. patent application Ser. No. 13/029,374, entitled "Method and System for a Hierarchical Temporal Memory Utilizing a Router Hierarchy and Hebbian and Anti-Hebbian Learning," which was filed on Feb. 17, 2011 now U.S. Pat. No. 8,041,653, and which was a continuation of U.S. patent application Ser. No. 11/966,479, entitled "Hierarchical Temporal Memory Utilizing Nanotechnology," which was filed on Dec. 28, 2007 now U.S. Pat. No. 7,930,257, and which claims priority to U.S. Provisional Application Ser. No. 60/878,928, entitled "Hierarchical Temporal Memory Utilizing Nanotechnology," which was filed on Jan. 5, 2007, the disclosure of which are both incorporated by reference herein in their entireties. This patent application therefore claims as its priority date, Jan. 5, 2007.

TECHNICAL FIELD

Embodiments generally relate to object and pattern recognition devices, methods and systems. Embodiments are additionally related to neural networks and neural devices, such as, for example, artificial synapse integrated circuit (IC) components and chips.

BACKGROUND OF THE INVENTION

Adaptive Learning Statistical Memory

Building artificial systems capable of learning and intelligent behavior has been a goal of researchers for many years. This goal has largely not been achieved. A recent theory developed by Jeff Hawkins referred to as the Memory Prediction Framework (MPF) has shed some light on a difficult problem. The MPF postulates that the Biological Cortex (BC) functions by constantly trying to predict the future. Through a series of predictions that are met, or not met, the cortex learns to recognize objects, build causal relationships between objects, initiate and direct behavior. Hawkins has postulated a general architecture termed Hierarchical Temporal Memory (HTM) that follows the MPF. The details of the MPF and HTM, as laid out by Hawkins, are available in many sources, both in a book written by Hawkins titled "On Intelligence" and many web-sources.

HTM is a very promising concept. However, there is one significant flaw to HTM as a commercial technology. This flaw has to do with the practical implementation of the HTM algorithm at biological-scale. By biological scale we are referring to the neural and synaptic numbers and densities found in most mammals equal in size or larger than a mouse. Underlying the MPF is a hypothesis that the BC is really a type of "statistical learning memory". Rather than calculating like a computer, the cortex is accessing memory. This is not Random Access Memory, where an address is given and the memory returns the data stored at the address. Nor is it Content Addressable Memory, where the data is given and the address of the pattern that best matches the data is returned. Rather, the MPF requires a combination of a new form of RAM and CAM memories. The MPF requires a type of RAM that returns statistical probabilities, hereafter referred to as Knowm Random Access Memory (KRAM) and also a new type of CAM memory that learns to name patterns, hereafter referred to as Knowm Content Addressable Memory (KCAM). The concepts of KRAM and KCAM are discussed in greater detail herein. In general, the MPF requires that hundred millions to billions of these modules containing KRAM and KCAM memories be connected in a vast hierarchical network. This system is extremely interconnected and adaptive, which presents major problems to the traditional electronics framework. Solutions to these problems are discussed in greater detail herein.

Before proceeding detailing the unique solutions described herein, it should be made perfectly clear just how much of a problem it is to implement HTM, in a practical way, at a scale that is biologically realistic. Most researches are only familiar with one problem, termed the "Connection Problem". In fact there are three problems, each with equal significance. These are:

1) The Connection Problem
2) The Communication-Power Problem
3) The Adaptive Problem The embodiments discussed herein demonstrate how these three problems can be solved in the framework of hierarchically structured adaptive learning memory systems such as HTM. Before proceeding with a detailed discussion of solutions offered by such embodiments, the magnitude of these problems and then their solutions are discussed as follows.

The Connection Problem

BC is incredibly interconnected. It has been estimated that the human cortex contains about 30 billion neurons, each connecting to roughly 1000 other neurons. It would seem that building an artificial system composed of billions of nodes and arranging that each node can communicate with thousands of other nodes is big problem. This is what is referred to as the Connection Problem.

It has been assumed that the connection problem can be solved by multiplexing signals over common lines. In effect, it is argued that since the component neurons of BC are actually quite slow, and since modern electronics are about 1-1000 million times faster, we may use this property to send signals over common wires. In fact this solution is short sighted, as it does not take into account how much power would be wasted in charging up wires. The hallmark of BC is its energy efficiency. An implementation that consumes more power than a modern Laptop PC will not be practical in a host of applications. Practically, we can safely make the statement that a computing system that consumes more electricity than the average suburban home, roughly 3 kW, will not have widespread commercial appeal.

The Communication Power Problem

No matter how the connection problem is solved, there is another significant problem. This problem presents itself when dealing with very large scale memory systems like BC. Modern electronic fabrication is two-dimensional (i.e. 2D). Assuming that neural circuit modules are mapped to a 2D chip surface, the question needs to be asked: how can a three-dimensional interconnected structure be mapped to a two-dimension surface and scaled without introducing significant problems in communication distance? FIG. 1 depicts the nature and significance of the problem. FIG. 1 illustrates a simple prior art 3D modular architecture 100, wherein each module thereof communicates only with its neighbors. FIG. 2 further illustrates a chart 200 outlining the computational costs of simulating a biological-scale cortex.

Communication takes energy because a wire must be charged. The total charge held on a wire is a function of its capacitance, and it capacitance is a function of its size (i.e. length). The energy expended in communication is thus directly proportional to how far energy must travel. As one can see from the FIG., as the 3D lattice gets bigger, the distance between the vertical layers in the 2D architecture grows longer, but in 3D the distance never grows. Brains are highly interconnected structures, yet beyond just the number of connections, it should now be apparent that the way they are connected, i.e. the topology, is also very important. From the above example, one can see how a seemingly simple 3D interconnected topology will get increasingly harder to simulate with modern 2D fabrication technology.

It should be noted that the Central Processing Unit does not solve this problem because it must store and access memory across a set distance. In fact, the CPU is guaranteed to be at least twice as inefficient as a direct mapping to a chip surface for a modular architecture, since memory must be retrieved and then put back again, resulting in twice the necessary communication. To illustrate just how inefficient CPU's are at simulating communication-intensive structures like BC, it may be helpful to look at the results of actual simulations performed by Christopher Johansson and Anders Lansner at the Department of Numerical Analysis and Computer Science, Royal Institute of Technology in Stockholm, Sweden. The results of their study indicate how much GFLOPS of computation power, as well as memory and bandwidth would be needed to simulate various biological cortexes, ranging from a mouse to a human.

The results of this study highlight how ill suited dominant CPU computational paradigm is when building biological-scale adaptive memory systems. To illustrate just how much power would be required to simulate the various mammalian cortexes at current power densities, the chart 300 depicted in FIG. 3 puts the simulation power requirements into perspective. To simulate a human cortex with modern CPU's in real-time would require enough electricity to power 44,000 average suburban homes, cost roughly $780 million for just the computers, and cost $111,000,000 per year in electricity.

Yet as many are quick to point out, computational power is doubling every 2 years according to Moore's law . . . so we will get there soon. But this argument is again short sighted. While transistor densities are increasing exponentially, so is the power density. In other words, a chip with twice the transistor count will consume more than twice the power. The solution is therefore not going to come from faster computers, but from a new kind of computer.

The Adaptive Problem

A synapse is both a processor and a memory element. When a neural system is calculated rather than physically emulated, every synaptic update requires the movement of information from a memory cell to a processor. The human cortex contains on the order of 1 quadrillion multi-bit synaptic connections. 1 quadrillion memory accesses and updates occurring on every pattern search is truly impractical for a calculation machine unless the update and memory access occur in the same location.

These problems can be completely overcome by building a one-to-one neural system, where a neuron is represented by a dedicated circuit and a synapse by a dedicated physical connection. Assuming the connection problem has been solved we also need system that provides continual adaptation. This means that every synaptic connection must retain the ability to be changed every time it is used. It is well understood that BC is a massively parallel system, which means all the synapses are used repeatedly for almost all, or all, of its calculations. To change a memory bit we must provide enough energy to change the memory state, which is provided by the application of a sufficiently high switch voltage. As the voltage decreases, random thermal energy becomes a major source of unwanted bit faults. Low operating voltages lead to bit faults because we must allow for adaptability at that voltage. High voltages and billions of connections lead to excessive heating which, in turn, lead to bit faults. This is the Adaptive Problem.

Power increases as the square of the voltage, which means there is a serious dilemma when building a biological scale adaptive system. To build a compact system with 1000 trillion adaptive synaptic connections that does not "cook" itself requires a low operating voltage. If the equilibrium voltage of the biological neuron were raised to 1.8V from its current 60 mV, the human brain would dissipate about 18 kilowatts, enough power for 6 suburban homes. Even with biological connectedness, a solution will not present itself without low operating voltages.

When one considers these energy arguments, it's clear that looking for thermally stable synaptic connections is a relatively fruitless endeavor. The solution to the adaptive problem has to do with working with unstable memory elements, or meta-stable switches.

The embodiments described herein thus detail how to construct a biological-scale hierarchical temporal memory that can operate at comparable energy densities to biology. The solutions to the above problems will be apparent as such embodiments are described in greater detail herein.

Based on the foregoing, it is believed that a need exists to perform massively parallel object recognition. In particular, a need exists for performing pattern recognition of an unlimited size databases in a fixed time interval. It is a believed that a solution to this need involves the use of nanotechnology components and systems as disclosed in greater detail herein.

BRIEF SUMMARY

The following summary is provided to facilitate an understanding of some of the innovative features unique to the embodiments presented herein, and is not intended to be a full description. A full appreciation of the various aspects disclosed herein can be gained by taking the entire specification, claims, drawings, and abstract as a whole.

It is, therefore, one aspect of the embodiments to provide for a data-processing method and system.

It is another aspect of the embodiments to provide for a hierarchical temporally memory.

The above and other aspects can be achieved as will now be described. Methods and systems are presented for constructing biological-scale hierarchically structured cortical statistical memory systems using currently available fabrication technology and meta-stable switching devices. Learning content-addressable memory and statistical random access memory circuits are detailed. Additionally, local and global signal modulation of bottom-up and top-down processing for the initiation and direction of behavior is disclosed.

Varying embodiments are disclosed. For example, in one an embodiment, a method for a hierarchical temporal memory can implemented, which includes for example, the steps of providing a hierarchical temporal memory comprising a plurality of modules; and permitting at least one module among the plurality of modules to override in the hierarchical temporal memory, a recognition with a prediction by a modulation of a Dopa parameter, such that when an override thereof occurs, data flows down the hierarchical temporal memory. In another embodiment, a step can be implemented for arranging an uppermost module among the plurality of modules to retain control over at least one output from the hierarchical temporal memory, if all modules among the plurality of modules in the hierarchical temporary memory have elevated Dopa parameters so that all of the modules provide recognition overrides.

In still another embodiment, a step can be implemented for actively regulating control over at least one output of the hierarchical temporal memory to allow for a rapid gating of the hierarchical temporal memory, wherein at any point in time, control of the hierarchical temporal memory is provided to at least one module that can best predict a future state of the hierarchical temporal memory. In another embodiment, a step can be provided for providing a top-top configuration signal that compares a confidence of each module among the plurality of modules and regulates respective Dopa parameters thereof in respond to the top-top configuration signal.

In still other embodiments, the aforementioned top-top configuration signal for comparing the confidence and regulating the Dopa parameters of each module among the plurality of modules can be accomplished via a pseudo code. In yet other embodiments, the aforementioned top-top configuration signal for comparing the confidence and regulating the Dopa parameters of each module among the plurality of modules can be accomplished electronically. In other embodiments, for all modules among the plurality of modules in the hierarchical temporal memory, starting from a lowest level module and moving to a highest level module thereof, a variable local to each module among the plurality of modules can be generated/created, which represents a current confidence of the module. The variable can be designated as a confidence buffer.

In yet other embodiments, for all modules among the plurality of modules in the hierarchical temporal memory, starting from sad lowest level module and moving to the highest level module thereof, the confidence buffer can be compared to a confidence buffer of respective parent module thereof. In other embodiments, the confidence buffer may be greater than the confidence buffer of the respective parent module thereof, and a set amount added to the Dopa parameter. Additionally, the at least one module among the plurality of modules can be designated as equal to at least one respective parent module thereof. In yet other embodiments, if the confidence buffer is lower than the confidence buffer of the respective parent module thereof, a set among from the Dopa parameter can be subtracted, or no activity taken. In still other embodiments, the process can continue until a lowest level module among the plurality of modules is attained. In yet other embodiments, the Dopa parameter can be be expressed mathematically as $D=\alpha D_1+\beta D_2+\gamma D_3$, where $D_3$ is controlled via dynamic gating.

In another embodiment, a system for a hierarchical temporal memory can be implemented. Such a system can include, for example, at least one arbitrary hierarchical structure mapped for a two-dimensional layout in order to provide for the hierarchical temporal memory; and a memory for storing pattern probabilities, wherein the pattern probabilities are fed up and down the hierarchical temporal memory; a flip-lock component that generates a flip-lock cycle for providing anti-Hebbian learning and wherein the flip-lock component further generates a flip-lock cycle for providing Hebbian learning, in combination with weight decay; a router hierarchy for generating at least one feedback signal to control the Hebbian learning and the anti Hebbian learning; a critical period during which all neural nodes in an ensemble in the hierarchical temporal memory receive a synaptic update; and an active period during which all neural nodes in the router hierarchy compete for a Hebbian update. In other embodiments, such a system can include a subsystem for prediction override regulation.

In still other embodiments, a regulator can be provided for regulating the prediction override regulation via a Dopa parameter, wherein a decay period is utilized for synaptic renormalization. In still other embodiments, the Dopa parameter can be regulated by a global rule and a local rule. In yet other embodiments, the Dopa parameter can be regulated based on proportion to a temporal derivative of a confidence. In still other embodiments, a prediction magnitude can be measured by post-synaptic current activation. In yet other embodiments, a prediction magnitude can be measured by the synchronous firing of neurons among the neural nodes of the hierarchical temporal memory/system. In still other embodiments, a confidence threshold can be regulated by adaptively accumulating expectations. In yet other embodiments, a prediction magnitude can be increased in an amount proportional to the Dopa parameter.

In still another embodiment, a system for hierarchical temporal memory, can be implemented. Such a system can include a hierarchical temporal memory comprising a plurality of modules; at least one module among the plurality of modules that overrides in the hierarchical temporal memory, a recognition with a prediction by a modulation of a Dopa parameter, such that when an override thereof occurs, data flows down the hierarchical temporal memory; and a regulator for actively regulating control over at least one output of the hierarchical temporal memory to allow for a rapid gating of the hierarchical temporal memory, wherein at any point in time, control of the hierarchical temporal memory is provided to at least one module that can best predict a future state of the hierarchical temporal memory.

BRIEF DESCRIPTION OF THE DRAWINGS

The accompanying figures in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate an embodiment of the present invention and are not intended to limit the scope of the invention.

Distributed Adaptive Architecture

The solution-space to the problems described earlier lies in the design and implementation of distributed architectures. The limit of distributed architecture occurs when memory and processing become indistinguishable, as in biological systems. Such a limit can be referred to as a Distributed Adaptive Architecture (DAA). DAA offers greatly reduced communication distances and massive parallel processing as compared to CPU architectures, which can dramatically reduce size and power.

To realize the goal of practical, biological-scale HTM systems, the algorithm should preferably be mapped to a DAA on a 2D chip surface. In principal, all possible architectures can be mapped to a 2D topology if a great amount of wire is used to connect the component modules. Energy costs, however, will increase dramatically as wiring lengths increase. Hierarchical DAAs are special because they can be mapped to a 2D topology and scaled while preserving inter-module wire lengths. This can be seen in FIG. 4, which graphically illustrates a 2D mapping of an arbitrary modular, hierarchy organized system 400.

Figure 1:
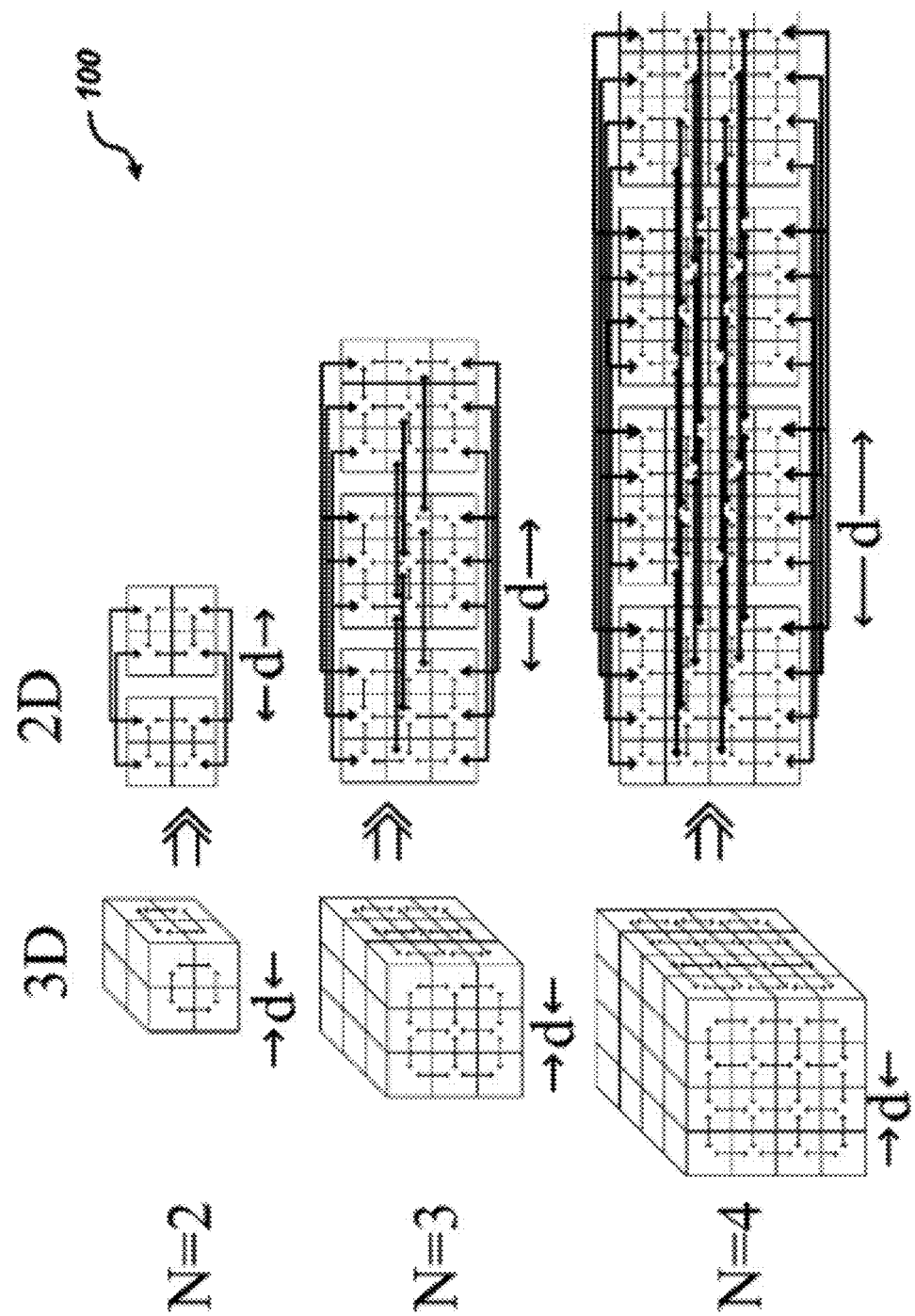
FIG. 1 illustrates a hypothetical 3D modular architecture, wherein each module communicates only with its neighbors.
Figure 2:
FIG. 2 further illustrates a chart outlining the computational costs of simulating a biological-scale cortex.
Figure 3:
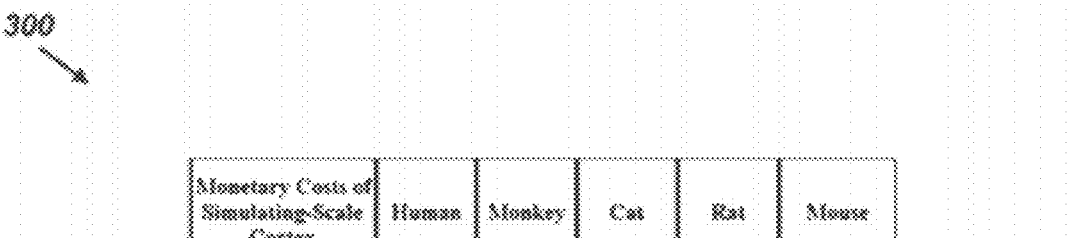
FIG. 3 illustrates a chart outlining simulation power requirements and monetary costs of simulating a biological-scale cortex.

Hierarchical DAA's enable efficient local and global communication and are indefinitely scalable. They are well suited to mapping onto current 2D microelectronics because making the system twice as large does not affect the wire lengths of component modules. In other words, one can take one hierarchical system and join it with another hierarchical system to make one larger hierarchical system without affecting the component hierarchical systems. This is certainly not the case with the 3D local connection topology discussed earlier with respect to FIG. 1. The connection topology of a hierarchical system is therefore actually 2D.

Interestingly, HTM is modeled after the BC, which is actually a 2D sheet, about the size of a dinner napkin and about as thick. The fact that neurons in the BC are arranged in 2D rather than 3D manner is strong evidence that its architecture is hierarchical. If BC were not hierarchical, then one could make the reasonable assumption that evolution would have evolved the sheet into a more efficient three-dimensional structure.

Figure 4:
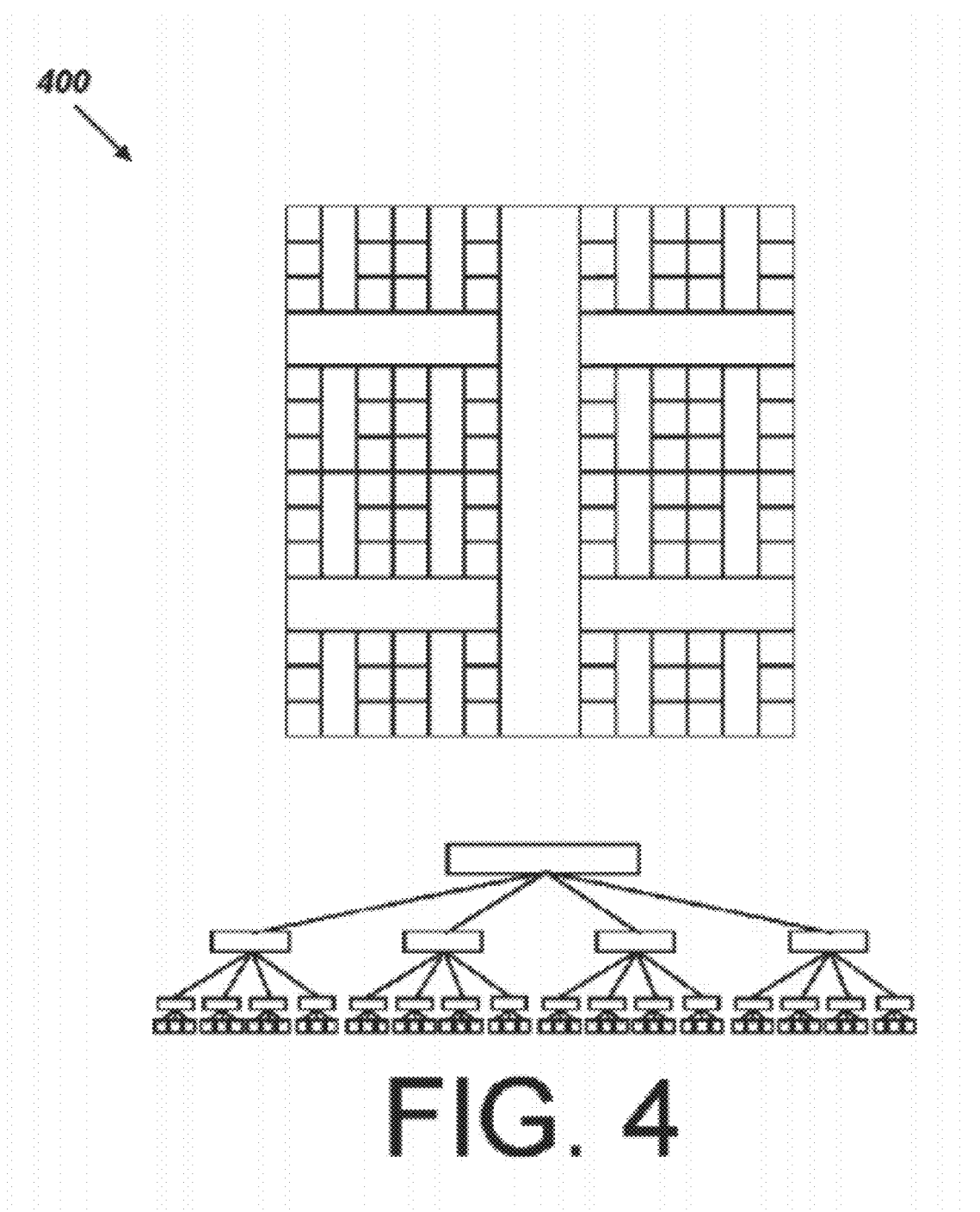
FIG. 4 illustrates a 2D mapping of an arbitrary hierarchical structure, which can be implemented in accordance with an embodiment.

The simplicity of what is being shown in FIG. 4 should not distract one from its importance. For very large biological-scale hierarchical systems, the difference between a chip architecture that is organized in a manner similar to FIG. 4 versus a chip architecture that is arbitrarily arranged will likely result in a factor of over a million decrease in power dissipation related to communication.

To illustrate this incredible difference we can compare two hypothetical cases. Consider the total distance that information must travel in one "iteration" of a hierarchically organized series of modules, for the case of a DAA and/or CPU architecture. To simplify the math, assume the DAA is a binary hierarchy, where the distance from the N level node to the N−1 node decreases by a factor of 2. Starting at the top of the hierarchy, the total distance that information must travel is:

$$\text{Dist}_{DAA} = (D) + 2 \cdot (D/2) + 4 \cdot (D/4) + \ldots$$

$$\text{Dist}_{DAA} = D(1+1+1+\ldots)$$

$$\text{Dist}_{DAA} = DN$$

Note that D is the distance from the highest level node to the second highest level and N is the total number of hierarchical levels. Now consider the CPU, where information must travel a set distance from memory to processor. For a large-scale highly modular systems, one can be assured that this set distance is (at least) comparable to D. In this case, the following equation can be followed:

$$\text{Dist}_{CPU} = D2^{N+1}$$

Energy is expended when a wire is charged. The amount of charge required is a function of the wire's capacitance, and the capacitance is a direct function of the wires length. This means the energy expended in communication in a DAA architecture and a CPU architecture for hierarchical algorithms is the difference between linear and exponential in N, or stated in terms of the total number of modules:

$$\frac{E_{CPU}}{E_{DAA}} \approx \frac{\#\ \text{Nodes}}{\log_2(\#\ \text{Nodes})}$$

This is an incredibly significant difference. Note that the example of a binary hierarchy was given only for the sake of simplicity of argument. The actual generating equations will depend on the size of the modules and the exact hierarchical description. However, in all cases the saving in communication energy in a DAA will be exponential over the CPU.

It can be seen from the following that hierarchical systems can be mapped to a 2D chip surface and scaled while preserving inter-module wire lengths. We will now discuss how to build the basic HTM module. It will then be apparent how to build adaptive HTM modules and then map them to a 2D chip surface.

KHTM Overview

The HTM algorithm comprises a hierarchical assembly of modules, where each module: 1) learns, names and recognizes the most probable pattern sequences in data input to the module; 2) passes the currently recognized pattern sequence names up the hierarchy, which are used to learn, name, and recognize higher-level pattern sequences; and 3) passes pattern sequence predictions down the hierarchy, which are used to bias the recognition of incoming patterns at lower levels in the hierarchy.

A successful DAA implementation of HTM will require sub-modules that can accomplish these feats. Such sub-modules and components are based on an adaptive device referred to as a "Knowm Synapse" which is discussed in U.S. Pat. No. 6,889,216 entitled "Physical Neural Network Design Incorporating Nanotechnology" and based on a physical neural network concept referred to generally by the term "Knowm". U.S. Pat. No. 6,889,216 issued to Alex Nugent by the U.S. Patent & Trademark Office on May 3, 2005 and is incorporated herein by reference in its entirety. A copy of U.S. Pat. No. 6,889,216 is also included in Appendix A of this patent application. A "Knowm Synapse" is thus a method for providing an adaptive synapse connection for use with large integrated electronic circuits. It may be appreciated that the Knowm synapse is one example of an adaptive synaptic element, or more generally an array of meta-stable switches, and that many types of meta-stable switches may be used.

Figure 5:
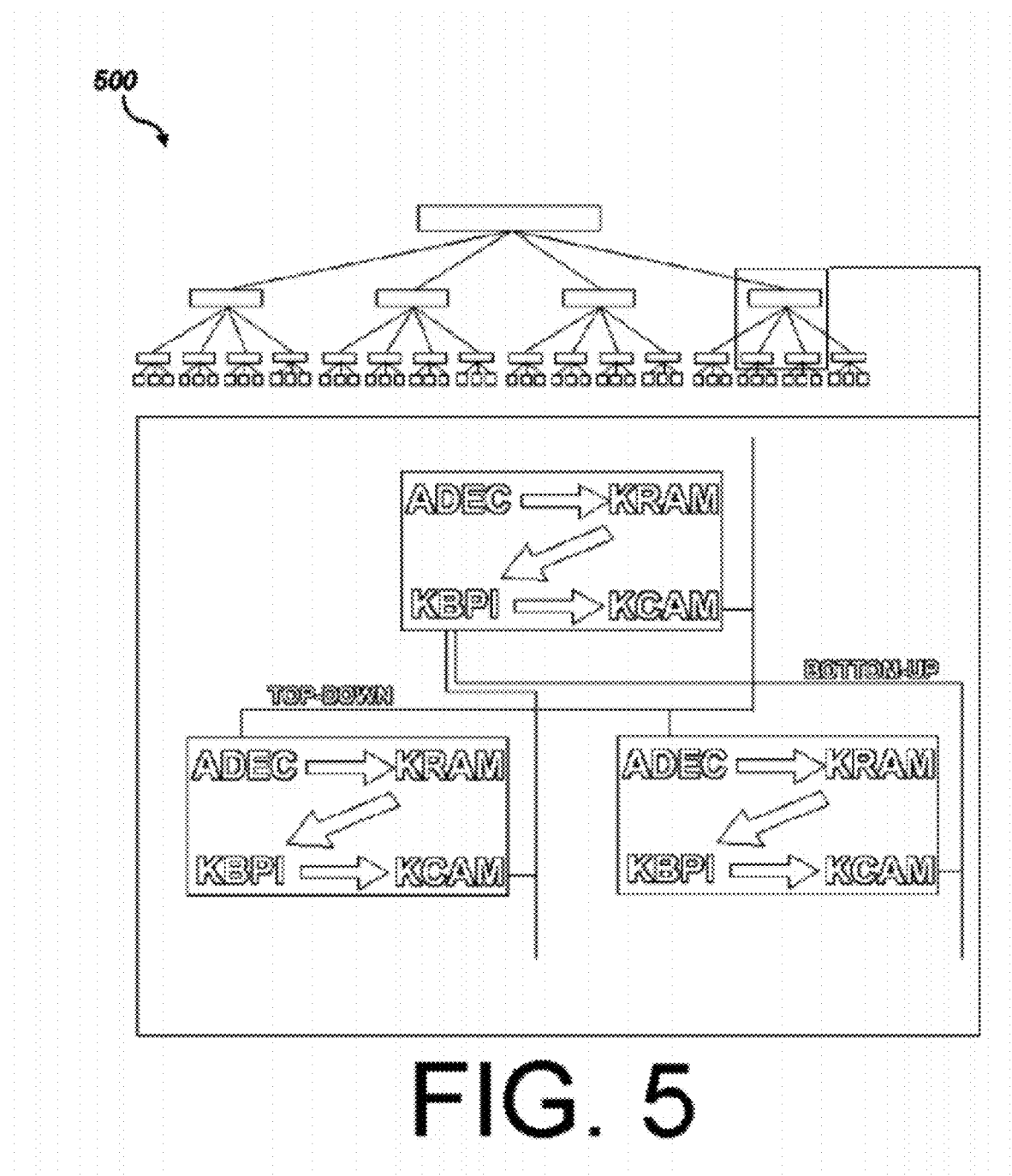
FIG. 5 illustrates a inter-module wiring scheme, which can be implemented in accordance with an embodiment.

The functions which can be used for providing the features of an HTM system can be attained in a Knowm framework by 4 subcomponents:

1) Knowm Temporal Buffer and Prediction Integrator (KTBPI)
 Integrates top-down prediction with bottom-up recognition.
 Buffers spatial patterns to form a spatial sequence
2) Knowm Content Addressable Memory (KCAM)
 Learns, recognizes and names spatial sequences
3) Knowm Random Access Memory (KRAM)
 Predicts spatial sequences
4) Address Decoder (ADEC)
 Provides top-down communication between KCAM and KRAM These subcomponents can be seen in the inter-module wiring scheme 500 depicted in FIG. 5. As indicated in FIG. 5, the bottom-up patterns enter the HTM modules via the KBPI. The KBPI takes the pattern and perform two functions. First, it takes the output of the KRAM, a top-down prediction of a pattern, hereafter referred to as the "Prediction", and the bottom up pattern, hereafter referred to as the "Recognition", and generates a new pattern, hereafter referred to as the "Compromise". The Compromise is fed to the KCAM sub-module, which recognizes the Compromise and gives it a name pattern. The details of how the KCAM both learns to recognize, recognizes, and then forms stable name patterns for the Compromise patterns will be discussed shortly. The name pattern is fed both up and down the hierarchy to the module's parent and children. The parent module takes the pattern into its KBPI and performs the steps just mentioned. The child module takes the name pattern and decodes it with its ADEC. The decoded name pattern is fed to the KRAM, which forms a probabilistic measurement of the Compromise patterns that were active for each parent name pattern. How the KRAM accomplished this will be discussed shortly. The KRAM generates a prediction that is fed to the KBPI. The KBPI then uses the Prediction to generate the Compromise, and the cycle continues.

KRAM

Figure 6:
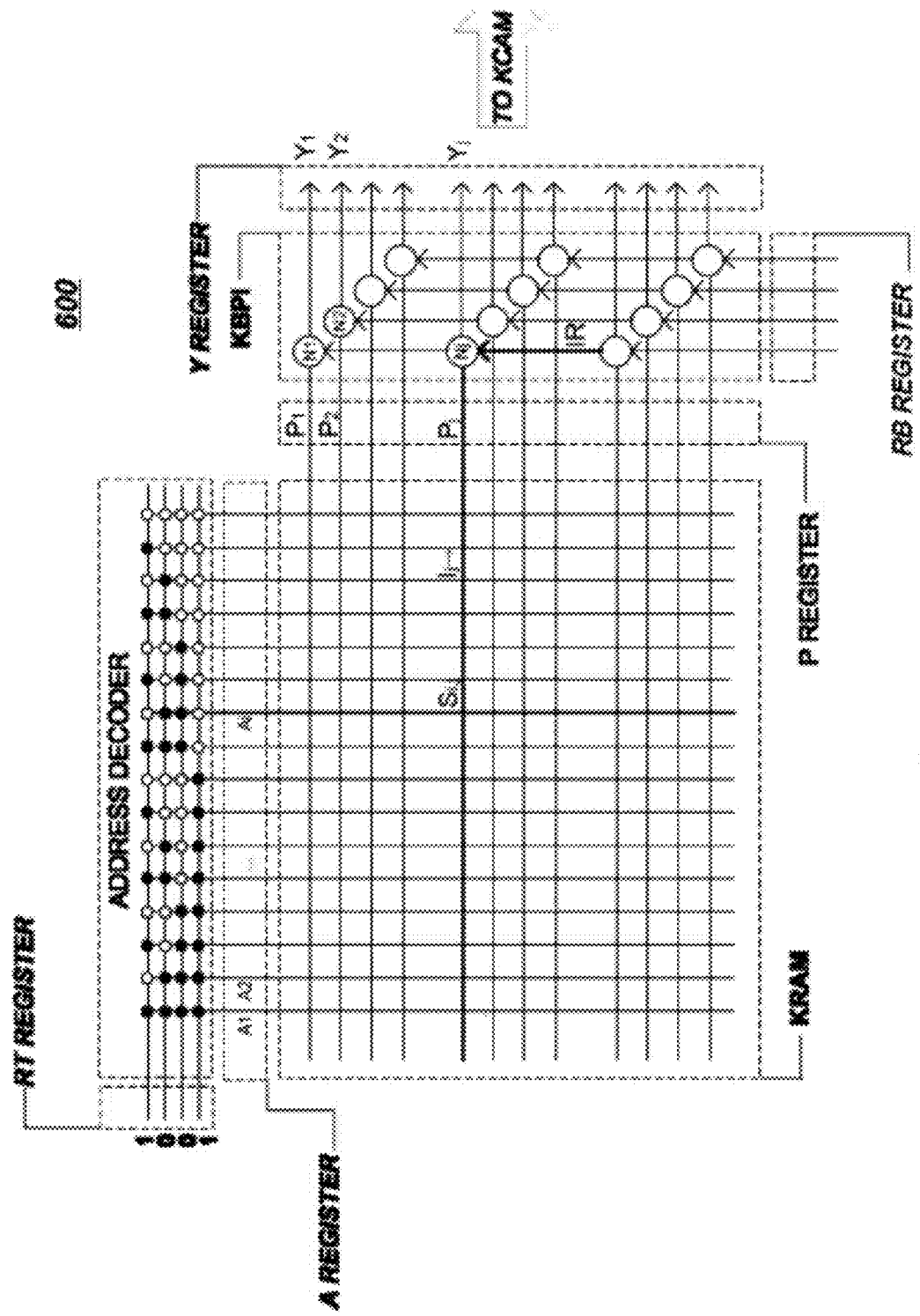
FIG. 6 illustrates a schematic of a KRAM system, which can be implemented in accordance with an embodiment.

KRAM (pronounced Kay-Ram) is an array of Knowm synapses formed from the intersection of the A registers "axonic" electrodes and the P registers "dendritic" electrodes, which are depicted in the schematic KRAM system 600 illustrated in FIG. 6. A name pattern is loaded onto the RT registers by the parent KCAM. This name pattern is decoded by the ADEC and one electrode is activated. This is comparable to standard RAM, where the line shown in bold is the word line. Synapses formed at the intersection of the word line and the P register electrodes charge the P register electrodes to either a positive or negative voltage. For the above statement to make sense it is important to understand how neurons and synapses are formed in Knowm systems. This has been covered in past patents and patent applications by this inventor, but to summarize, either the pre- or post-synaptic electrode must be represented as a differential electrode pair. A synapse is then a pair of connections. It is in this way that a synapse can invert a signal. For more information, the interested reader is directed to [the flip lock patent].

The KRAM outputs a prediction based on the value of its synapse. The Prediction is available on the P register and it comprises a series of synaptic currents, where the current is directly proportional to the synaptic values connecting the word line to the P register. The values of the synapses are updated according the Flip-Lock Cycle, which is provided by the neural nodes of the KBPI subsystem. Details of the Flip Lock cycle will be discussed shortly. However, the interested reader is directed to [the flip lock cycle patent].

To understand how the KRAM synapse array comes to represent a probabilistic measure, one must first recognize each name pattern of a parent module's KCAM has a unique address, which results in the corresponding electrode activating (raised to the supply voltage) in the modules KRAM. For the sake of example, the active electrode is labeled "Aj" in FIG. 6. Synapse Si,j provides synaptic current Ij onto Prediction line Pj of neural node Nj. Neural node Nj takes both synaptic current Ij and neural node current IR and generates an output, Yj. The state of output Yj is then used to provide feedback to synapse Si,j via the Flip-Lock Cycle. The synapses connecting the word line to the P register allow current to flow onto the dendritic electrodes of the neural nodes that form the KBPI module, which will be discussed shortly. The KBPI neural nodes take as input the Prediction and the Recognition currents and, subject to parameters that will be discussed, evaluate at either a positive or negative state. The synaptic states are then reinforced according to the Hebbian plasticity rule by the flip-lock cycle, which is provided by the neural nodes of the KBPI. Before we can explain how the synaptic values of the Ai word line of the KRAM come to represent a statistical measure of the Y register when the Ai word line was active in the past, it is necessary to discuss Hebbian learning in the context of weight decay.

Hebbian learning can be stated most simply as a learning rule that modifies the synaptic weights of a neuron as a function of how the synapse is used. The term Hebbian Learning has come to encompass a large number of update rules, but the type of Hebbian learning used in this disclosure is the most commonly stated rule, also known as activity-dependant Hebbian learning, and can be written as:

$$\partial \vec{W} = \vec{X} \cdot f(Y)$$

$$Y = \vec{W} \cdot \vec{X}$$

Note that dW represents the change in the synapse vector, X represents the pre-synaptic input vector and Y represents the post-synaptic neuron activation, or the dot product of the input vector X and the synaptic weight vector W. The variable f(Y) is a function such that f(Y) is positive when Y is positive and negative when Y is negative. f(Y) may also be asymptotic so that the total update decreases as Y increases in magnitude. It is immediately clear that the weight update is only ever in the direction of the input vector, X.

Figure 7:
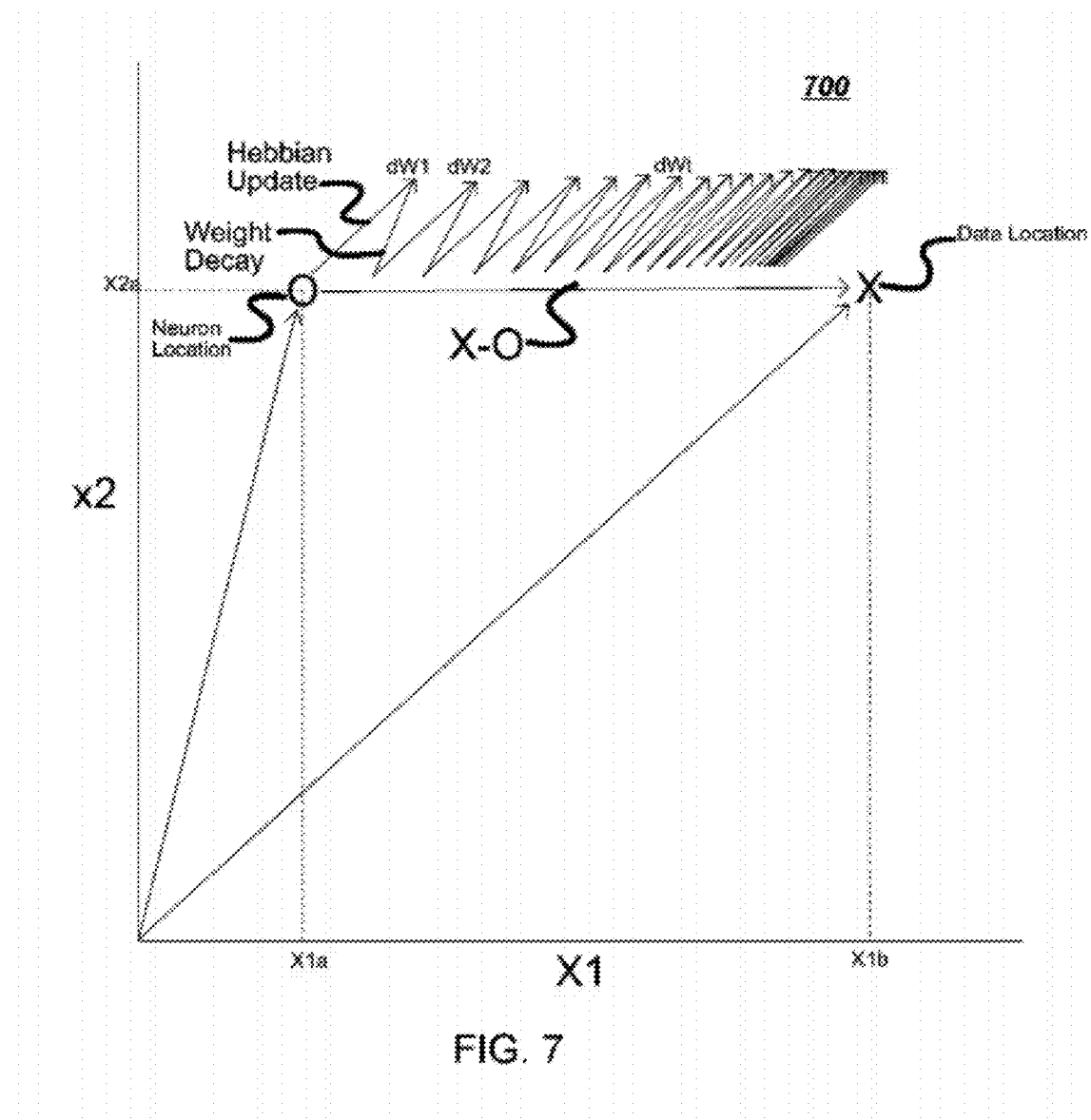
FIG. 7 illustrates Hebbian learning and weight decay, which can be implemented in accordance with an embodiment.

This can be seen in FIG. 7, which shows a graphical representation of a hypothetical neuron with two inputs, X1 and X2. The graph 700 depicted in FIG. 7 illustrates Hebbian learning and weight decay. The initial synapse values are X1=X1$a$ and X2=X2$a$ and is marked by a bold "O". The input data location, which is marked by a bold "X" can be plotted along with the location of neuron. Given the occurrence of data point X, we would like the weights of the neuron to be modified such that they move closer to X. The direction of this update is not in the direction of X, which is the direction we can obtain from Hebbian learning. If weight decay is proportion to the weight's size, then weight decay will always move the weight vector in the direction of the zero axis. One can see from FIG. 7 that the combination of weight decay and Hebbian learning will move the weight in the direction of (X-O). If X is the only data point, then the weights will eventually match in the data vector X.

To understand how this is used to measure probability, one must take a close look at FIG. 6. One can see that, for any neuron in the KBPI, only one synapse in a component KRAM is ever active. The input, Ai, is always positive. For the sake of clarity, we will say that when input line Ai is active its value is +1 whereas when it is not active its value is 0. Because the state of the neuron N j may be positive or negative, synapse Wi,j may be either positive or negative, depending on the history of the state of neuron Nj. If we assume that neuron Nj is only ever positive then it follows that synapse Wi,j will be positive.

Figure 8:
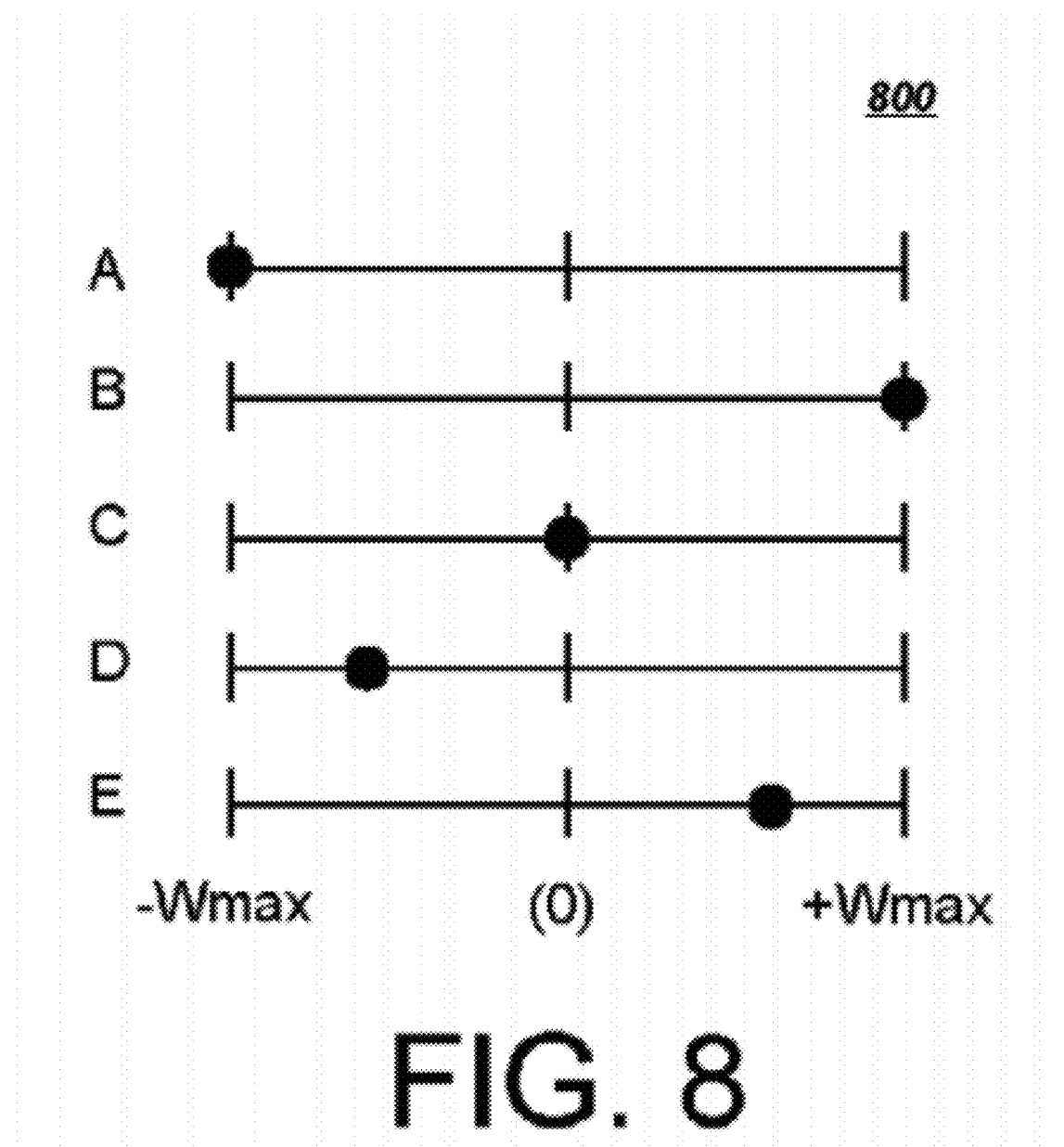
FIG. 8 illustrates synaptic weight values for various types of input statistics, which can be implemented in accordance with an embodiment.

Likewise, if neuron Nj is only ever negative then synapse Wi,j will be negative. It may not be known exactly what the learning and decay rates are, but we may say confidently that in these extreme cases the synaptic weight will saturate at a maximum values, +Wmax and −Wmax. Now consider the case where neuron Nj evaluates to +1 as many times as it evaluates to −1. If the occurrence of +1 and −1 is sufficiently mixed we can safely say the value of the synapses will be 0. These cases can be seen in FIG. 8, along with some intermediate cases. FIG. 8 illustrates a schematic representation 800 synaptic weight values for various types of input statistics.

One can appreciate the significance of the configuration illustrated in FIG. 8 quite simply by first reviewing the configuration of FIG. 6. Suppose, for example, that line Ai is active on every time step and that neuron Nj always evaluates to −1. In this case the synapse Wi,j will saturate at −Wmax, which can be seen in case A of FIG. 8. On the other hand, if Nj always evaluates to 1 then synapse Wi,j will saturate to +Wmax, which can be seen in case B. If neuron Nj evaluates to +1 at a rate equal to the rate it evaluates to −1, then the synapse will receive just as many positive updates as negative updates and the synapse value will remain at zero. If neuron Nj evaluate to both +1 and −1, but evaluates to +1 more than −1, the weight will stabilize at a value intermediate to +Wmax and 0, which can be seen in case E. Alternately, If neuron Nj evaluate to both +1 and −1, but evaluates to +1 less than −1, the weight will stabilize at a value intermediate to −Wmax and 0, which can be seen in case D. The weight's value is thus a statistical measure of how neuron Nj has evaluated in the past. The total temporal window that is represented by the weight is a function of the learning and decay rates of the synapse.

Looking back to FIG. 6 it should now be apparent how the synaptic weight Wi,j, and the synaptic current Ij, is a measure of the probability of the past state of neuron Nj. With this in mind, it is not hard to see how the prediction register is a probabilistic representation of the patterns present when line Ai was activated in the past. It is also not hard to see how the device relies on the volatility of the component synapses to function, which is important because of the Adaptive Problem. By building weight decay into the operation of the device, the Adaptation Problem can be overcome. If the input line Aj occurs at a rate sufficient to keep the weights stable, then the system as a whole will be stable. This places restraints on the ultimate size and structure of the HTM modules and leads to a structural phase change in the KHTM system, a topic that will be addressed shortly.

KCAM

Figure 9:
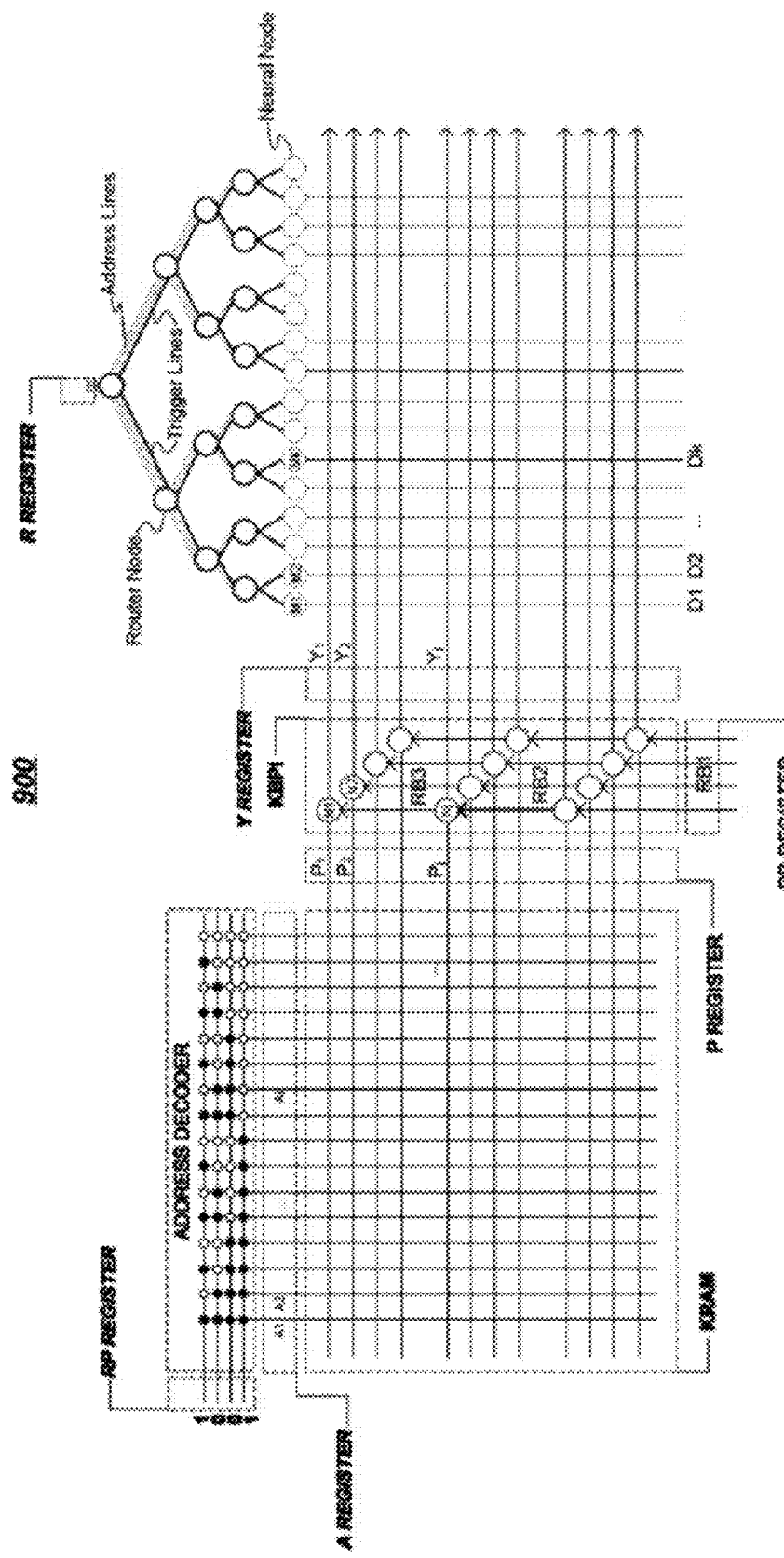
FIG. 9 illustrates a system comprising a KHTM module's component ADEC, KRAM, KBPI and KCAM subsystems, which can be implemented in accordance with an embodiment.

As mentioned previously, the main function of the KCAM sub-module is to recognize patterns and give the patterns a name, hereafter referred to as a name pattern. Recognizing patterns first requires classifying a pattern, or learning to recognize the pattern. This process can be understood as a type of unsupervised clustering algorithm where each neural node in the KCAM represents a quantization point, i.e. a location in the pattern space. The KCAM learns to associate some patterns with one neural node and other patterns with other neural nodes. In essence, the KCAM divides up all the patterns it sees into M bins, where each bin can be thought of as a neuron. The KCAM finds the neuron with the best match to the current pattern and outputs the neurons address on its R register, which can be seen in the system 900 depicted in FIG. 9. The illustration depicted in FIG. 9 depicts system 900, including a KHTM module's component ADEC, KRAM, KBPI and KCAM subsystems.

The learning mechanism that allows the KCAM to find and stabilize these quantization points is intimately related to the Flip-Lock Cycle, a mechanism for providing Hebbian and Anti-Hebbian plasticity to collections of meta-stable switches. The Flip-Lock cycle is a general rule for conveying information between neurons while allowing for adaptive modification and is detailed in [the flip-lock cycle patent]. There are many circuit configurations possible for providing the feedback mechanisms necessary to implement the Flip-Lock Cycle. For example, there are three possible electrode configurations, which we refer to as 1-2, 2-1 or 2-2. We will show the example of the 2-1 configuration, i.e., "2 axonic and 1 dendritic" configuration. There are also two ways to operate the flip-lock cycle, the pre-synaptic flip and the post-synaptic flip. We will demonstrate the use of the pre-synaptic flip. Thus, in the example we are showing, we are using the 2-1 pre-synaptic flip configuration.

Figure 10:
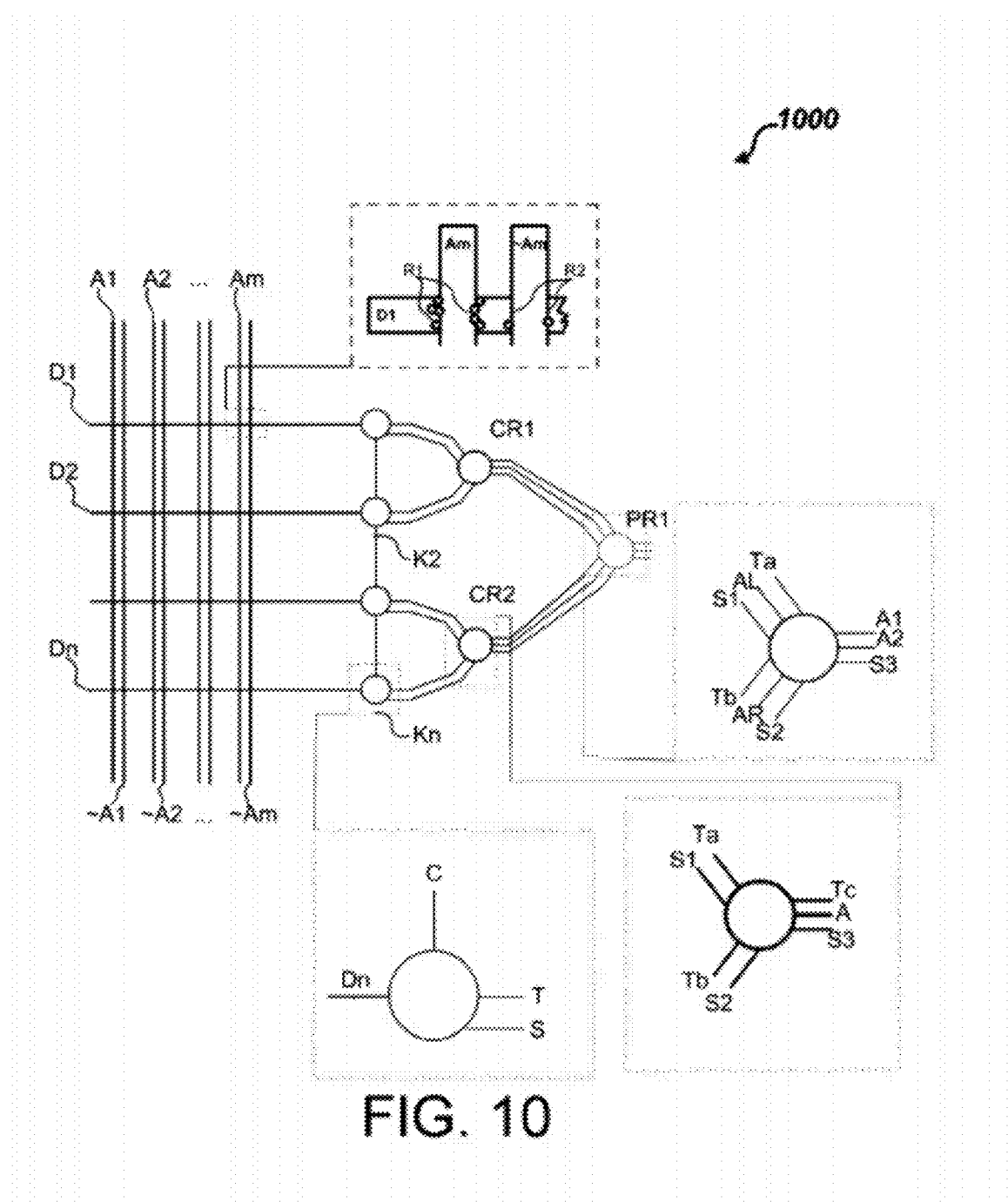
FIG. 10 illustrates a KCAM subsystem, which can be implemented in accordance with an embodiment.

FIG. 10 illustrates a KCAM subsystem 1000, which can be implemented in accordance with an embodiment. Before the KCAM circuit outlined in FIG. 10 can be understood, it is necessary to understand the Flip-Lock Cycle, which will be explained in reference to the adaptive connections R1 and R2, dendritic electrode D1 and axonic electrode Am and ~Am of FIG. 10. Because the circuit in FIG. 10 depicts a 2-1 configuration, line Am is a differential pair, where ~A indicates the logical compliment of A.

Figure 11:
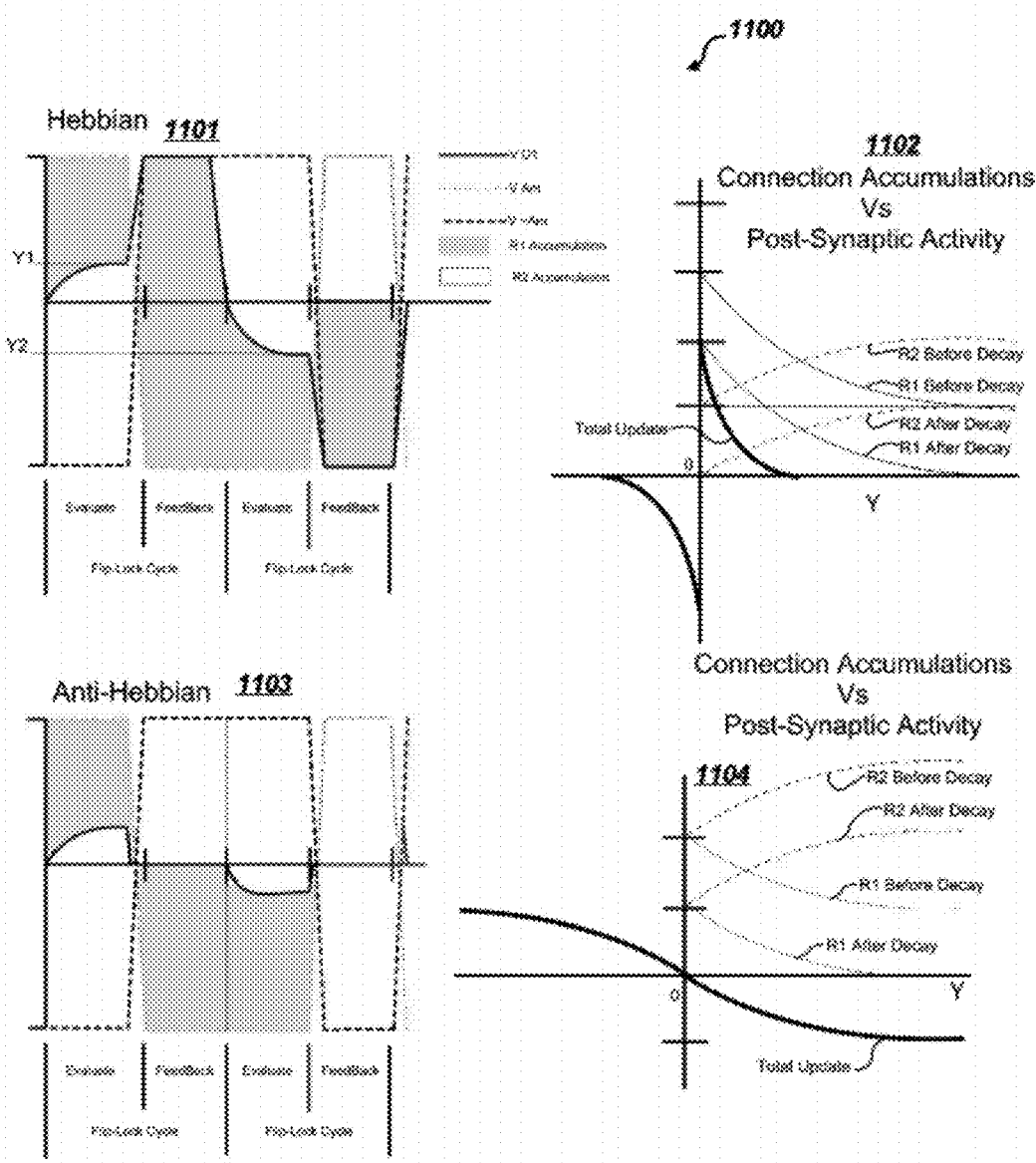
FIG. 11 illustrates the Flip-Lock Cycle, which can be implemented in accordance with an embodiment.

FIG. 11 illustrates a group of graphs 1100, including graphs 1101, 1102, 1103, and 1104 that together illustrate the Flip-Lock cycle. As one can see from FIG. 11, the Flip-Lock Cycle has both a Hebbian and an anti-Hebbian form. Also, it can be seen that the Flip-Lock cycle is a two-phase process. To help the reader follow, FIG. 11 has been referenced to FIG. 10, so that V D, V Am and V ~Am are in reference to the voltage on electrode D1, Am and ~Am, respectively.

Conducting channels between the axonic electrodes (Am and ~Am) and the dendritic electrode (D1) are formed from ensembles meta-stable switches. FIG. 10 illustrates Knowm nanoparticle bridges, although any meta-stable switch will suffice. For example, refer to U.S. Patent Publication No. 20070022064 by inventor Alex Nugent, entitled "Methodology for the Configuration and Repair of Unreliable Switching Elements" for a definition of a meta-stable switch and how they may be used for universal logic functions. As one can appreciate, the Hebbian update is activity-dependant so that the weight update goes to zero as the post-synaptic activity increases. The Anti-Hebbian update has the opposite activity-dependant form. That is, the update is greater for large post-synaptic activations and goes to zero for larger activations. These activity-dependant forms are used by the KCAM sub-module to learn quantization points.

During the evaluate phase, electrode D1 is charged. The voltage on D1 will be dependant on the state of the synaptic weights connecting the axonic electrodes to D1. A synapse is a differential pair of connections, which are indicated in FIG. 10 as R1 and R2. If R1>R2 we may say that the connection is positive. Likewise, if R1<R2 then the synapse is negative. If R1=R2 then the synapse is zero. FIG. 11 illustrates a positive connection. If D1 evaluates to a positive value, then D1 is forced to saturate at either the positive or zero state, depending on if the update is Hebbian or anti-Hebbian. If the update is to be Hebbian, then D1 is saturated at the state equal to it's evaluate state. At the same time, the pre-synaptic voltages flip state. This can all be seen in FIG. 11. Since the dendritic electrodes are locked (held constant) and the axonic electrodes are flipped, one can see why this is called the flip-lock cycle. If the update is Anti-Hebbian then the post-synaptic voltage is set to zero. This causes R1 and R2 to receive equal accumulations during the feedback cycle and acts to make the update anti-Hebbian.

If connections R1 and R2 are composed of meta-stable switches, then the total change in the value of the connections will be dependant on the voltage-time product across the terminals. The accumulation for R1 can be seen visually in FIG. 11 as the area between the axonic electrode voltage VAm and dendritic electrode voltage V D1. Likewise, the accumulation for R2 can be seen visually in FIG. 11 as the area between the axonic electrode ~Am and dendritic electrode D1. During both the evaluate and feedback phases the connections are subject to thermal decay because they are formed of meta-stable elements. The total update to the synapse can be found by subtracting the accumulation on R2 from the accumulation on R1, then adding the total (negative) accumulation due to thermal decay. The plots in FIG. 11 demonstrate this and clearly show the Hebbian and Anti-Hebbian update forms.

We are now at a point to discuss the various components of the KCAM. Before we do, it will be helpful to understand what the KCAM sub-module must accomplish. When one understands what a KCAM must do, then it should be apparent how the function can be accomplished with many relatively simple circuits, both synchronous and asynchronous.

The KCAM must operate in two states. The first state is termed the "Critical State". During the Critical State, each neural node within the KCAM must act as one node. That is to say all neurons must have the same post-synaptic activation. In addition, it is required that the weight update to each node be of the Hebbian form shown in FIG. 11. We will refer to this plasticity rule as the "Act As One Hebbian" or AAOH rule. This may be accomplished in two ways. First, all of the neurons' dendritic electrodes could be electrically coupled together. Second, the state of the nodes in an ensemble can be controlled by one "leader" node.

The second state is termed the "Active" state. During the active state each neuron operates independently, with one exception. The KCAM must be configured so that the neural node with the strongest post-synaptic activation gets a Hebbian update of the form shown in FIG. 11 while all the remaining neurons in the ensemble receive the anti-Hebbian update of the form shown in FIG. 11. Stated another way, only the "winner" neural node gets the Hebbian update whereas all the "loser" neurons receive the anti-Hebbian update. We will refer to this rule as the "Winner-Take-All Hebbian" or WTAH rule. During the Active state it is also necessary for the KCAM to output the binary address of the winner neural node. These are the sole requirements of the KCAM and are summarized for the reader:

KCAM Requirements:
Critical State: AAOH Plasticity
Active State: WTAH Plasticity and Outputs address of winning neural node A description of a circuit topology will be discussed herein, which can provide these functions. It may be helpful to the reader to review a related device by the present inventor that is detailed in U.S. Patent Publication No. 2006/0184466 entitled "Fractal memory and Computational Methods and Systems Based on Nanotechnology" which was published on Aug. 17, 2006. U.S. Patent Publication No. 2006/0184466 is incorporated herein by reference in its entirety. A copy of U.S. Patent Publication No. 2006/0184466 is included in Appendix B herewith. Both the Fractal Memory device of U.S. Patent Publication No. 2006/0184466 and the KCAM sub-module are hierarchically structured router trees designed to propagate the address of the winning node to the top of the hierarchy, which we will refer to as the "R Register", short for the Recognition register.

As one can see from FIG. 10, the KCAM may be composed of an ensemble of neural nodes, labeled K1 through Kn. In addition, the KCAM has a hierarchical assembly of router nodes. In effect, each router node must accomplish the same task. The number of terminals on a router node is dependant on its level in the hierarchy. Child router nodes, which are the router nodes that connect directly to the neural nodes, can be seen in FIG. 10, labeled CR1 and CR2. There will be n/2 child router nodes, where n is the number of neural nodes in the KCAM ensemble. These child router nodes connect to the neural nodes via the trigger lines, labeled Ta and Tb, and the state lines, labeled S1 and S2. The function of a child router node depends on its state.

We will arbitrarily define that when the state terminals are low, the node is in the Critical state, whereas a high state terminal indicates the router node is in the Active state. In this way, if the router node's S3 terminal is low it will make its S1 and S2 terminals low. The router node performs no additional function when in the critical state.

When the child router node S3 terminal is high then it is in the Active state. The router node will then take the following actions. First, it will force the S1 and S2 terminals high. Second, it will perform the following time-critical routing functions. We will express the router node function as pseudo code, but the reader should understand that these operations must be carried out by a physical device, not a computer, to realize performance advantages.

```
CRITICAL STATE      {
S1= S3
S2=S3
                    }
ACTIVE STATE {
If at time t:    Tc<<Ta and Tc<<Tb, then Ta→Low and Tb→low
Else if: Ta>Tb and Tc~0 then Ta→High and Tb→Low and Tc→High
Else if: Ta<Tb and Tc~0 then Ta→Low and Tb-High→High
If Tc is high then A is set to the voltage of Ta
Reset Ta, Tb and Tc to zero.
```

The function of the parent router node is actually the same as the child router node, but because the number of address lines increases by one for each level of the hierarchy it is helpful to see a case other than the child node. For the case of a third-level parent router node that is not the highest in the hierarchy, which is not shown in the illustrated figure:

```
CRITICAL STATE      {
S1= S3
S2=S3
                    }
ACTIVE STATE {
If at time t:    Tc<<Ta and Tc<<Tb, then Ta→Low and Tb→low
Else if: Ta>Tb and Tc~0 then Ta→High and Tb→Low and Tc→High
Else if: Ta<Tb and Tc~0 then Ta→Low and Tb-High→High
If Tc is high then A2 is set to the voltage of Ta
If Tc is high then A1 is set to the voltage of AL
Reset Ta, Tb and Tc to zero.
```

Note that the only difference between the parent and child router nodes is that the parent router nodes must relay the address information generated by the child nodes.

Figure 12:
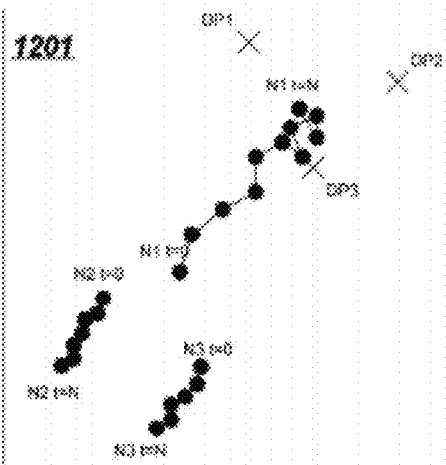
FIG. 12 illustrates graphs depicting the effect of a critical period, which can be implemented in accordance with an embodiment.
Figure 12:
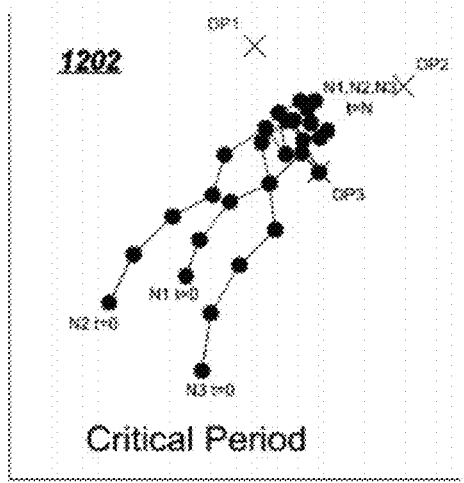
Figure 12:
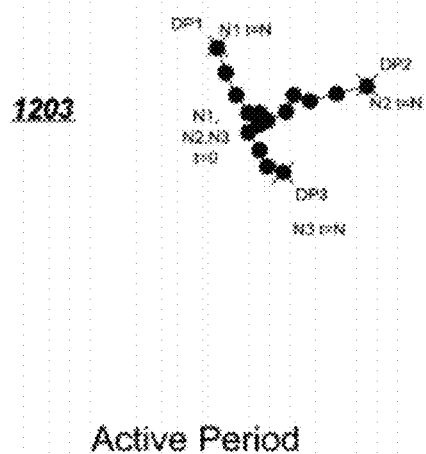

We will now explain how the KCAM learns to segment its data space and output stable name patterns and why it is important to have Critical and Active phases. For the sake of visually representing the learning rule it is necessary to use a two-dimension plan. This is not ideal because the KCAM operates in a much larger dimension. In addition, the KCAM only operates on binary data. In order to illustrate how the learning rule works we will have to show the case of non-binary data on a two-dimensional plan. This would correspond to a neuron with two inputs and two synaptic weights. We may thus plot both the synaptic weights and the input vectors on the same 2D plot. We will assume that the post-synaptic activation of the neuron is highest when its weights are equal to the input. Keep in mind that this is only true for normalized data and weight vectors. Nonetheless, the 2D graphics 1201, 1202 and 1203 depicted in FIG. 12 are helpful in visualizing the AAOH and WTAH plasticity rule. FIG. 12 illustrates graphs 1201, 1202, and 1203 depicting the effect of a critical period.

As indicated in FIG. 12, the locations of the neurons are indicated by dark circles. The data patterns, which are represented by an "x", indicate that only three data patterns, i.e. data points, exist. Assume that the frequency of the three data points, DP1, DP2 and PD3 are roughly uniform. The path of the synaptic weights of the neural nodes can be seen for time steps 1 through N by the connected dots, where each dot represents the synaptic values at a moment in time.

Recall from FIG. 7 that the combination of Hebbian learning and weight decay will move neuron's weights in the direction towards the input data vector. That is, the direction of the update can be given as $d\vec{W}=(\vec{X}-\vec{W})$, where X and W are the input data vector and the neurons weights, respectively. Note that this is not the same as moving in the direction of the input data vector, which is what would occur with Hebbian learning in the absence of weight decay. It follows from the above that anti-Hebbian learning and weight decay will move the neurons weights away from the data.

By analyzing the configuration depicted in FIG. 12, one can now understand why the critical period is important. When the KCAM is initialized, all weights must start at zero. If WTAH plasticity begins from this point, then it will likely occur that a few neurons will be closer to all data points than all other neurons are to any data point. {Note that this will not happen with two-dimensional binary data, which is why we must show non-binary data in the example.} In the absence of a Critical period only one or small percentage of neurons are used to represent data points. In other words, some or all data points result in the same neuron "winning" and thus each data point receives the same name pattern by the KCAM. This has the effect of preventing the KTHM system from learning to distinguish patterns. This problematic occurrence can be prevented by providing a critical period. During the critical period, each neural node receives the same Hebbian update as all other neural nodes. By the end of the critical period, the weights of each neural node are very similar and have been initialized to an ideal location. From this point, the weight of each neural node may then converge to a separate data pattern.

The process is analogous to a ball rolling down a mountain into a valley. The best place to start a ball rolling is the top peak of a mountain, where a slight push in any direction will lead the ball into a separate valley.

We may now discuss the consequences of the activity-dependant form of the Hebbian and Anti-Hebbian updates given by the flip-lock cycle and shown in FIG. 11. Stated simply, a highly active neural node will receive a larger anti-Hebbian update or a smaller Hebbian update. Likewise, a minimally activated neural node will receive a small anti-Hebbian update and a large Hebbian update. This has the following effect in its relation to the clustering process shown in FIG. 12. Assume for the sake of explanation that there are three neural nodes, A, B and C. Also assume that we are dealing with only one moment in time so that we may only speak of one data pattern, which we will call P. Assume that the weights of neural node A are closest to P. Also assume that B is close to P, but not as close as A and that C is much farther away. Thus, neural node A is most active, followed closely by neural node B and then lastly by C, which is minimally active. At this moment in time the activity-dependant Hebbian and Anti-Hebbian weight update will have the following result: Neural node A will be moved a little bit closer to P. Neural node B will be move a lot further from P. Neural node C will be moved away by a minimal, or zero, amount. In other words, the activity-dependant forms shown in FIG. 12 have the effect of quickly resolving disputes between neural nodes that are "fighting" for the same quantization location while allowing the nodes to converge steadily to independent quantization points.

Returning to FIG. 10, neural node Kn operates in two ways, depending on its state. If its S line is high then it will operate in the Active state. Likewise it will operate in the Critical state if its S line is low. When in the Active state, then the neuron acts in the following manner, which is described in pseudo code:

```
CRITICAL STATE {
        Evaluate Phase{
                Couple dendritic electrode to neighbor neural nodes'
        dendritic electrodes through line C.
                Integrate synaptic currents on dendritic electrode
                }
        Feedback Phase{
                provide Hebbian update, i.e. provide positive feedback
                to dendritic electrode
                }
        }
ACTIVE STATE{
        Evaluate phase{
                Integrate synaptic currents on dendritic electrode
                }
        Feedback Phase{
                T→D
                If T>=0: provide Hebbian update, i.e. provide positive
                feedback to dendritic electrode
                If T<0: provide Anti-Hebbian update, i.e. set dendritic
                electrode to zero volts.
                }
}
```

It can also be appreciated that the operation of the KCAM may proceed in an asynchronous manner. In fact, the hierarchical structure of the KCAM router nodes, as well as the neural nodes, may be configured for asynchronous use. This can clearly be seen from FIG. 11 with the flip-lock cycle, though it will require a post-synaptic flip which is detailed in the [Flip-Lock Cycle Patent].

KBPI

The KBPI sub-module is critical to the operation of the KHTM system as a whole and needed for integrating top-down predictions with bottom-up recognitions. The way that the KBPI biases the Recognition with the Prediction to form the Compromise can depend on a few parameters.

Figure 13:
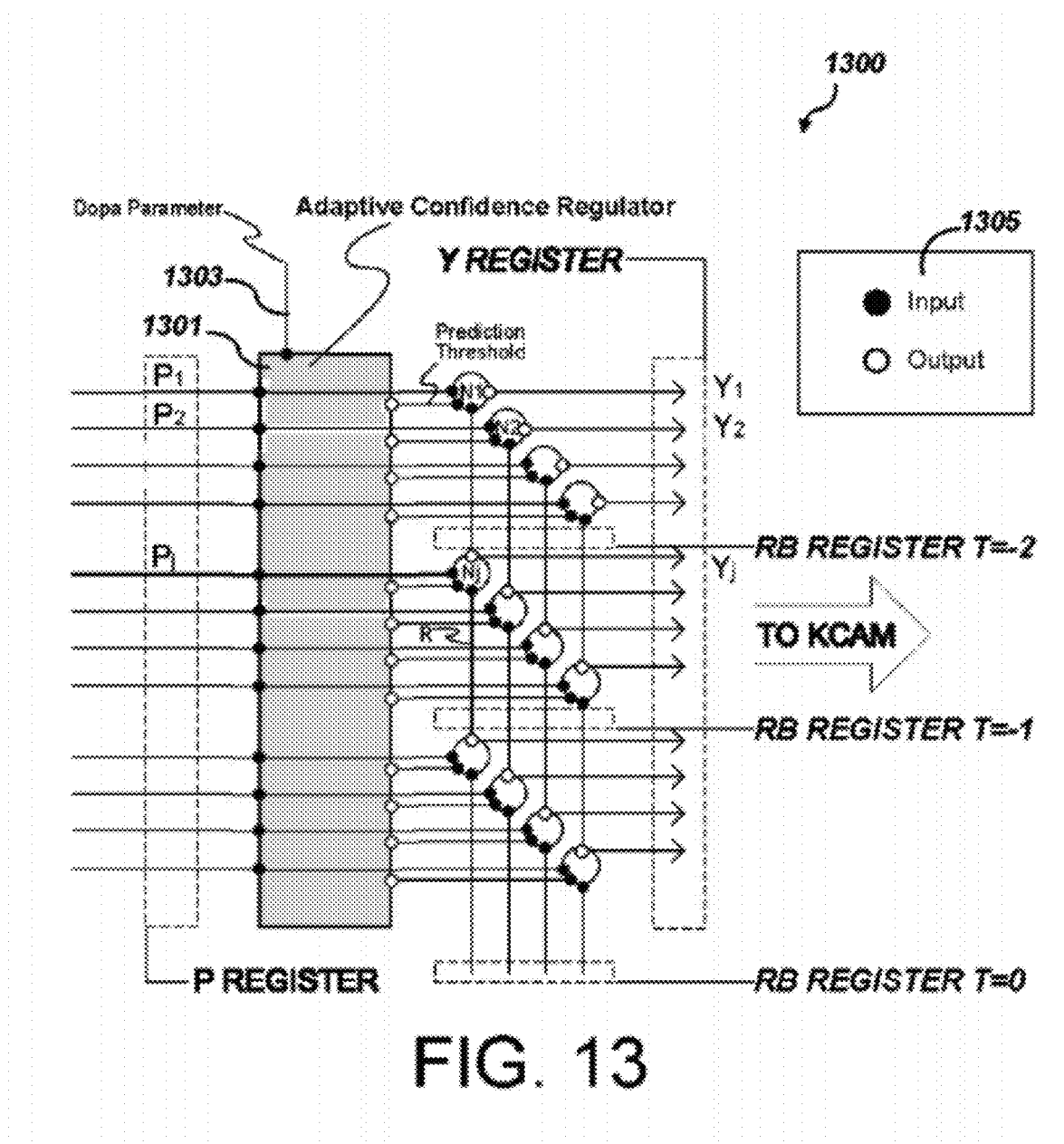
FIG. 13 illustrates an example Adaptive Confidence Regulator, which can be implemented in accordance with an embodiment.

FIG. 13 illustrates an example Adaptive Confidence Regulator 1300 system. Upon an initial review of FIG. 13, it may seem that the configuration of FIG. 13 is complicated. The functionality of the Adaptive Confidence Regulator system 1300, however, is actually quite simple. In the illustration of system 1300 in FIG. 13, a legend 1305 is included, with respect to "input" and "output". The system 1300 generally includes an Adaptive Confidence Regulator and a number of components, such as, for example, dopa parameter 1303. Recall that, other than providing a temporal buffering of the bottom-up recognition, the KBPI must use the Prediction to generate the Compromise. Also recall that the Prediction, which is available on the P register, is a graded current signal, where a larger current implies a larger prediction probability. The KBPI must decide when to use the top-down Prediction to "over-ride" its bottom-up Recognition. This decision is very important to the over-all KHTM system and must be regulated carefully. Failure to properly regulate a prediction over-ride will result in one of two polar-opposite states, which we refer to as the Schizophrenic and Parkinson's states, or the S and P state, respectively. We will first describe these states and then demonstrate how the Adaptive Confidence Regulator and the Dopa parameter may be used to properly regulate a prediction over-ride and prevent the KTHM system from falling into the S or P state.

The S State

The primary function of the KBPI sub-module is to regulate the occurrence of a prediction-over ride. We have previously shown how a prediction may arise via the action of the KRAM. This prediction represents the pattern that the parent KHTM module "expects" to see. If the KBPI is in the S state, then every prediction can override every recognition. This will have the effect of every upper-level module receiving the pattern that it expects to see. This disparity between the bottom-up recognition and top-down prediction grows over time because the prediction magnitude increases. Thus, over time, if the KBPI is in the S state, its internal representation of the patterns and sequences of the external world are purely a result of its internal state. For illustrative purposes, we may compare this process to a dream or a hallucination. It is desirable to selectively force the KHTM system into a global S-state for reasons of active repair of the KCAM and KRAM synapses, as will be detailed shortly. However, it is most certainly not an advantageous for the KBPI sub-modules to be in the S state if the KHTM system is to act on real-world information.

The P State

When a KBPI module loses all ability to use a Prediction to over-ride a Recognition then it loses all ability to direct behavior. To understand this statement, a basic tenant of the MPF must be understood. The MPF requires that motor movement is initiated and controlled by predictions of motor movement. Stated another way, walking from point A to point B is the result of predicting walking from point A to point B. When a prediction over-rides the bottom-up recognition, the prediction becomes reality. The act of walking, or generally any motor movement, requires precise and complicated sequences of motor movements. The MPF states that the complex series of motor movements is first generated by high-level modules, which project their prediction down the hierarchy. If child modules are able to use the top-down prediction to over-ride their bottom-up recognition, then they activate the most likely pattern that was present when their parent initiated that prediction in the past. In this way the top-level prediction is unraveled into an ever-growing complex sequence of patterns as it moves down the hierarchy and evolves over time.

From the description provided above, it is apparent that the ability to over-ride a recognition is critical to the initiation of behavior. In the P state it is therefore impossible to initiate a motor movement, which leads to paralysis. This symptom is often observed in humans after taking Dopamine-inhibiting medications or who are suffering from Parkinson's disease, hence the term "P state".

Adaptive Confidence Regulator (ACR) and the Dopa Parameter

With the exception of the repair cycle, which will be detailed shortly, it is crucial that the KHTM system does not fall into the S or P state. Rather, a fine balance must be struck. To understand how the ACR works we must first define some basic terms. These terms will be defined in general mathematical way, though one will see how the basic concept can be described by a number of various mathematical equations. The instantaneous Expectation is a measure of the similarity of the top-down prediction and bottom-up recognition:

$$E = \frac{N_{ts} - N_{err}}{N_{ts}}$$

Note that the Expectation (E) is a function of the total number of spatial and temporal bits (Nts) in the P and R registers and Nerr is a measure of the difference between the Prediction and the Recognition and may be quantized or graded. The expectation therefore will increase as the KHTM system's predictions match the bottom-up recognitions.

The Confidence is an adaptive average of the instantaneous expectations over time, which may be written as:

$$C_{t+1} = \{C_t + (E\lambda)\}(1-\delta)$$

The Confidence (C) is a recursive function of the instantaneous Expectation, the persistence factor λ, and the decay rate ∂. The confidence is therefore an adaptive average measure of the total accumulated Expectation over time. The Persistence factor controls the rate at which the Confidence can accumulate, whereas the decay rate controls how quickly the confidence will decay.

Intuitively, it makes sense that a prediction-over ride should be linked to a high confidence. To understand why, consider the case where a prediction over-ride is generated when the prediction magnitude exceeds a set threshold. If this occurs, then the KBPI's Compromise will more accurately reflect the top-down prediction. This will increase the likelihood that the parent module will recognize the pattern it is predicting, which will increase the prediction magnitude. If this continues to occur unchecked the system will fall into the S state. However, the modules "confidence" is a measure of its agreement with bottom-up recognitions. If the module starts to fall into the S state, then it may be corrected if the threshold for a prediction over-ride is linked to the module's current confidence. As long as a prediction is congruent with a recognition, that is to say the confidence is high, there is no need to raise the prediction override threshold. However, when the top-down Predictions become incongruent with the Recognitions, that is to say the Confidence starts to drop, the prediction threshold needs to be increased.

In addition to the adaptive regulation of the prediction threshold, which is accomplished by the ACR subsystem of the KBPI, it is desirable to have a global control of the prediction threshold, which we call the "Dopa" parameter. Global regulation of the prediction over-ride is important to "tune" the KHTM to sensory data streams of varying complexities, providing a mechanism for positive reinforcement, as well as inducing a global S-state necessary for periodic system repair, which will be detailed shortly.

Figure 14:
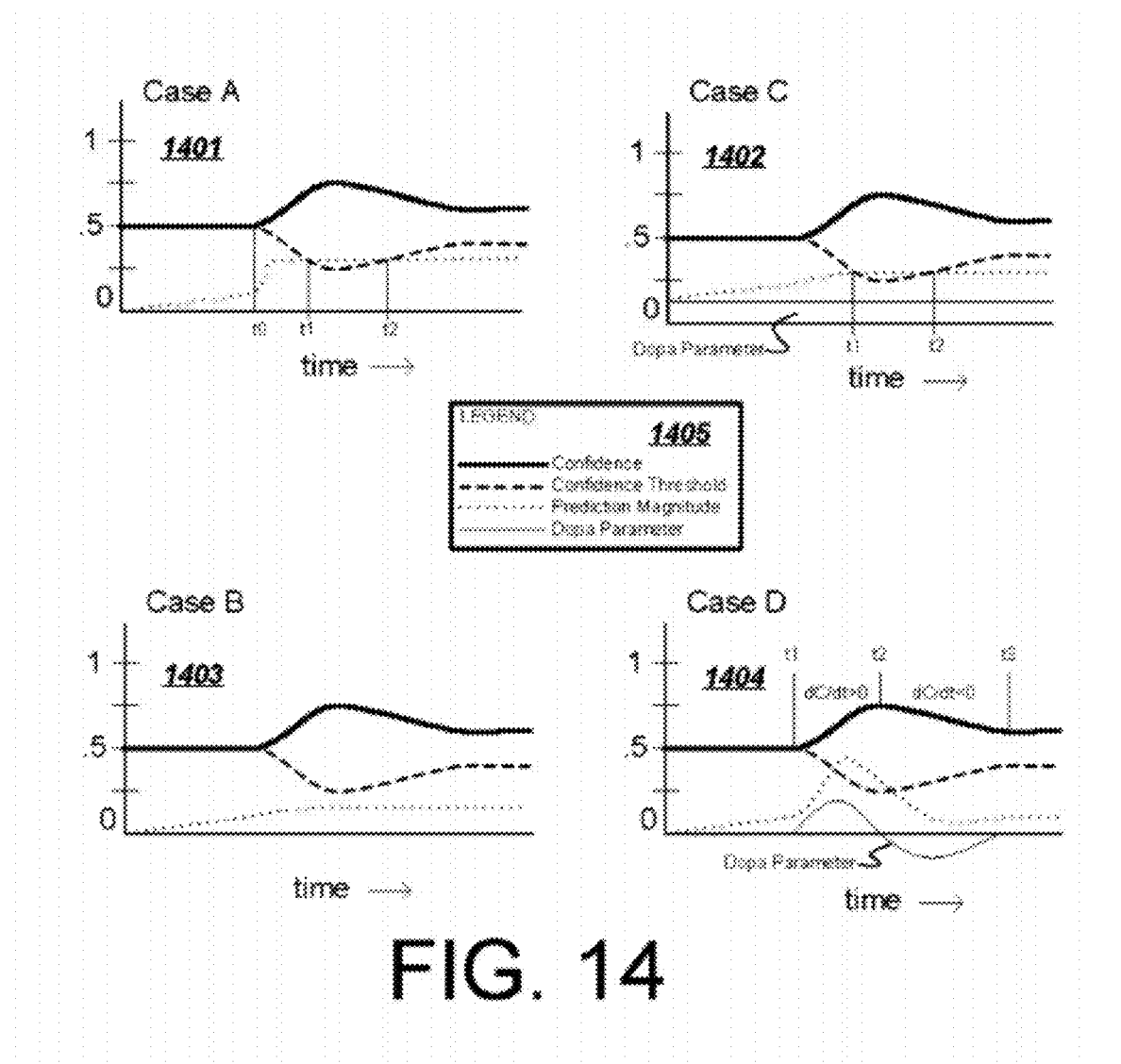
FIG. 14 illustrates graphs depicting the modulation of the Dopa Parameter and Confidence threshold for use in generating a prediction over-ride, which can be implemented in accordance with an embodiment.

With respect to the description provided above, one can now appreciate FIG. 14, which depicts how a neural node in the KBPI regulates the prediction over-ride. To assist the reader, FIG. 14 is discussed in reference to neural node Nj in FIG. 13. Thus, FIG. 14 illustrates graphs 1401, 1402, 1403, and 1404 depicting the modulation of the Dopa Parameter and Confidence threshold for use in generating a prediction over-ride. A legend 1405 is provided in FIG. 14 with respect to graphs 1401, 1402, 1403 and 1404.

FIG. 14 demonstrates four cases, labeled A,B,C and D, and plots hypothetical values of Confidence (C), the Confidence Threshold (CT), the Prediction Magnitude (PM) and the Dopa Parameter (DP). It can be seen that the CT is simply the inverse of C so that the CT will decrease when the confidence increases. This may be written simply as CT=1−C for the case shown in FIG. 14. However, it is apparent that other inverse relationships will also serve the same purpose. The function of neural node Nj can be described as follows. When the PM, shown in FIG. 13 as Pj exceeds the CT, neural node Nj's output state will agree with the prediction. Otherwise, Nj's output state will agree with the recognition.

One can see from Case A of FIG. 14 that before time t0 the Confidence is 0.5. We may take this to mean that, on average, the prediction Pj agrees with the recognition R 50% of the time, whereas it disagrees 50% of the time. Before time t0 the prediction magnitude increases steadily, which indicates that the KRAM is able to predict the recognition more than 50% of the time. After time t0 there is a sudden sharp rise in the confidence and the inverse sharp decline in the confidence threshold. Also note that at this time there is a simultaneous sharp rise in the prediction magnitude. We may infer from this two things. First, the KBPI Adaptive Confidence Regulator has responded to a sudden increase in the number of correct predictions. This rise is due to the sum of all predictions on all P-register lines. Second, there is a sudden rise in the prediction magnitude Pj. At time t1 the prediction magnitude crosses above the confidence threshold. At time t2 the prediction magnitude falls below the confidence threshold. Therefore, between time t1 and t2, neuron Nj allows the prediction Pj to override the recognition R. Note that shortly after t1 the confidence dropped, which terminated the prediction override. We may interpret Case A by saying that from time t1 to t2 the recognition R was controlled from the top-down, whereas the rest of the time it is controlled by the bottom up. Note that each KHTM model sends the compromise to its KCAM, which then projects the name pattern both up and down the hierarchy. In this way, one can see how a prediction event may propagate down the hierarchy.

Case B indicates a more likely scenario where a prediction magnitude cannot cross the confidence threshold. We may compare Case B to Case A and see that since the prediction magnitude Pj never rises above the confidence that it will never override the recognition R. In this situation it is not possible to initiate a behavior response. However, this does not prevent the confidence from rising, an indication that the predictions are congruent with the recognitions. In such a case it is desirable to bias the prediction with an offset which we call the Dopa Parameter. This can be seen in Case C.

Case C shows Case B with the Dopa Parameter biasing the prediction magnitude. Note that now a smaller prediction magnitude may result in a prediction override. Thus, one can see how the KHTM system can be transitioned from the P state to the S state by increasing the Dopa Parameter.

Case D illustrates another embodiment, wherein the dopa parameter is further modulated by local information. Notice that in Case B the Confidence rose for a period, which indicated that the top-down predictions were becoming increasingly more accurate. Unfortunately, the prediction magnitude was never able to rise above the confidence threshold and thus no prediction override, i.e. motor control, could be initiated. In this case one may make the observation that when the temporal derivative of the confidence is positive that means that the KHTM module's parent is making increasingly more accurate predictions.

To aid in explanation we will call the case where the Confidence is rising, that is dC/dt>0, to mean that the module is "happy". Likewise, we will call the module depressed when dC/dt<0. Note that the term "happy" and "depressed" are used within the strict mathematical context just mentioned and may or may not have anything to do with the biological sensation of happiness or depression. Based on the forgoing, one can see how it is advantageous for the Dopa level to rise when the module is happy and to decrease when the module is depressed. In this way the initiation of a behavioral response, that is a prediction override, may be tuned to the current state of the HTM module so that modules that are currently experiencing a rapid increase in Confidence will concede control to the parent module.

We may thus consider the Dopa parameter to be composed of multiple component signals, $D_1$, $D_2$ and $D_3$, where $D_2$ is a global-bias, $D_2$ is linked to the "mood" of the KBPI, i.e. the temporal derivative of its confidence, and $D_3$ is related to a dynamic gating mechanism that will be discussed shortly. This may be written simple as $$D = \alpha D_1 + \beta D_2 + \gamma D_3$$

Based on Case D it can also be seen how a global modulation of the Dopa parameter can be used to tune a behavioral response. To reinforce a behavioral response, i.e. a prediction override, one would increase the Dopa Parameter during the behavior. Alternately, to inhibit a behavioral response one would decrease the Dopa Parameter during the behavior.

It can also be seen how it is advantageous to adjust the proportion of $D_1$ to $D_2$ within modules of a KHTM hierarchy, where lower-level modes are more influenced by $D_2$ than $D_1$ and higher-level modules are more influenced by $D_1$ than $D_2$. This may be understood simply as follows. The higher-level modules are responsible for object recognition and prediction, whereas the lower levels interact directly with the motor systems. It is advantageous to initiate a high-level prediction only when a module has a high confidence, whereas it is necessary for the lower modules to be over-ridden at any time if a motor response is to be attained. Increasing the level of the $D_2$ signal for the lower levels thus makes the modules more compliant to the upper-levels.

Active Repair During the S State

The KHTM system described herein can be regarded as a very large statistical memory that seeks to recognize objects in a data stream and also predict the causal relationships between objects. These objects may be both special and temporal. One very significant requirement of the KHTM system is that the objects or sequences in the environment occur at a rate such that the reinforcement to the synaptic weights may counteract thermal decay. In fact, there are three distinct problems that must be overcome when on considers how a KHTM system could consistently recognize and initiate a behavioral response to patterns and sequences in the environment, particularly when these pattern do not occur regularly.

We can divide this problem into two parts and provide solutions to each. First, how are learned patterns and sequences retained in time periods where the patterns and sequences do not occur? Second, how can a KCAM module and/or a KRAM module come to represent a pattern that does not occur frequently in time? The answer to the first question has to do with the selective and recurrent modulation of the S state by increasing the Dopa parameter. The answer to the second question has to do with the hierarchical structure of sequences.

The KHTM system described herein is capable of storing a very large number of sequences due to its hierarchical structure. However, these sequences are stored in volatile synaptic weights that will decay to a zero-state outside the influence of adaptation. Without the regular occurrence of these patterns, the synaptic weights will decay to a zero-state and all information will be lost. First it must be understood that information is represented in a hierarchical fashion so that sequences and patterns are classified into larger and more generally encompassing categories as it moves up the hierarchy. This is often referred to as a shared-representation.

This has the effect of firing a number of neurons throughout the KHTM hierarchy every time a pattern occurs, which serves to refresh a number of statistical representations at the same time. For example, if each KHTM module was capable of recognizing ten patterns, then 10% of the total network will be repaired each time it views a pattern. However, it may occur that an extended period of time is focused on a relatively small portion of patterns and sequences stored in the KHTM. It is then possible to lose those statistical representations to the synaptic zero-state if the patterns and/or sequences are not processed by the KHTM system. In such a scenario it is advantageous to induce an S state in the KHTM system by increasing the Dopa Parameter.

Recall that when the KHTM enters the S state each module has total control over its child modules so that every pattern that it predicts will occur actually occurs. The internal neural states of the KHTM module neurons will progress through their stored sequences, in a manner related to, but not necessarily an exact reflection of, what it has experienced in a non-S state. During this period the KHTM system may visit a number of internal patterns not experienced during its non-S state period, refreshing the synaptic weights as it visits each pattern. One may compare this process at a very superficial level to the practice of refreshing capacitively-stored weights in a DRAM memory.

The Decay Period

It may also be necessary to provide a period of time whereby the KHTM's Dopa Parameter is set very low while all external stimuli are removed or randomized. In such a case there will be no recognizable patterns and the KHTM module will be incapable of forcing a prediction override. This will have the effect of allowing all weights to decay. However, since each synaptic weight is composed of a number of individual meta-stable switches, for example Knowm nanoparticle connections, the synapses decay in proportion to their size. Stated another way, each synapse has a half-life. During a period void of recognizable patterns, the very large synaptic weights will decay more than the smaller synaptic weights. Consider the case where the time period is chosen as one synapse half-life. In this case a synapse with value "2" will decay to 1, whereas a synapse with value 1 will decay to a value of ½. Note that the relative difference between the two values was 1 before the decay period and ½ after the decay period. Because predictions and recognitions are represented as synaptic currents, the period of decay has had the effect of normalizing the prediction magnitudes.

To fully understand this process one must recall that an upper-level prediction may only proceed down the hierarchy via the KCAM sub-modules. If only one pattern has been repeatedly recognized then it is possible that the following case will occur: Given two KCAM weight vectors, A and B, where the data pattern/patterns corresponding to the state of A has been activated repeatedly in the recent past whereas pattern B has not, it is possible that the large magnitude of A's synaptic weights will provide more post-synaptic activation that B, even though the weights of B more accurately reflect the pattern. As a numerical example, consider the following case:

$$X = [1, -1, 1, -1, -1], A = [2, -2, 0, 0, -2], B = [0.5, -0.5, 0.5, -0.5, -0.5]$$

$$X * A = 6$$

$$X * B = 2.5$$

Note that (*) indicates the dot-product.

Thus, even though the state of B is an exact match to X, the post-synaptic activation of A is much larger. Providing a Decay period thus serves the mathematical process of normalization.

The Repair Cycle

It can be appreciated that cycles of a decay period followed by the Dopa modulated S-state may be used to refresh and condition the internal synaptic states for optimal performance. Whereas the decay period serves to re-normalize the synaptic weights of the component KCAMs, the S-state preserves the causal relationships between objects, i.e. the probabilities contained in the component KRAMs.

The function of the KBPI may be configured for asynchronous use. Asynchronous use will require that the neural node implement the past-synaptic flip state, which is detailed in patent [the Flip Lock patent]. This may be accomplished by measuring the correlations in firing pulses from the output of the KBPI nodes. When a Prediction matches the Recognition, a neural node will have a high post-synaptic activation. This will in turn lead to its dendritic electrode charging at a faster rate, which will enable the neuron to fire a pulse sooner. If all neural nodes within the KBPI are active, they will all fire at the same time, thus leading to a heightened temporal coincidence. The Adaptive Confidence Regulator may thus use the temporal coincidence of the KBPI neural node pulses to measure the instantaneous Expectation, which in turn may be used to regulate the confidence threshold and Dopa parameter.

Meta-KHTM: Learning and Storing Uncommon Sequences

We face a potential problem related to learning patterns or sequences that do not occur frequently in time. Stated another way, consider the case of a large KHTM system. As one moves up the hierarchical levels the number of potential patterns may explode. For instance, out of vertical, horizontal and diagonal lines we may construct all letters of the alphabet. Out of the 26 letters in the English alphabet there are many thousands of words. There are even more possible sentences, and then paragraphs, etc. As we move up the hierarchical levels the number of potential patterns increases dramatically. As an illustrative example, consider the case of the word "Unami". This is not a common word, and it is quite possible that its frequency of occurrence in normal conversational English is almost zero. However, it is certainly possible that once, perhaps during a cocktail party one learned that Unami was the name of the $5^{th}$ taste, added to the list of bitter, salty, sour and sweet. Over the course of a few minute-conversation it is certainly possible for a human cortex to learn this word, and thousands of other words or objects, never forget them for years even though the synapses in the biological cortex are subject to continual faults at a time scale of minutes.

One of the many benefits of a hierarchal structured representation of information is that any specific object may be composed of a number of primitive types, where each primitive type may be composed of yet more primitive types, etc. For a KHTM system to form a stable name pattern for an infrequently occurring pattern, it is necessary that the pattern be recognized not as the pattern in its entirety but as a group of sub-patterns. We may assign a KCAM module to sub-pattern, thereby keeping the internal synaptic states of the component KCAM's refreshed by the constantly occurring base patterns, i.e. alphabet. We refer to such a KCAM as a "Meta KCAM". This can be seen in the configuration of FIG. 15, which illustrates a FIG. 15 illustrates a Meta-KCAM system 1500.

Figure 15:
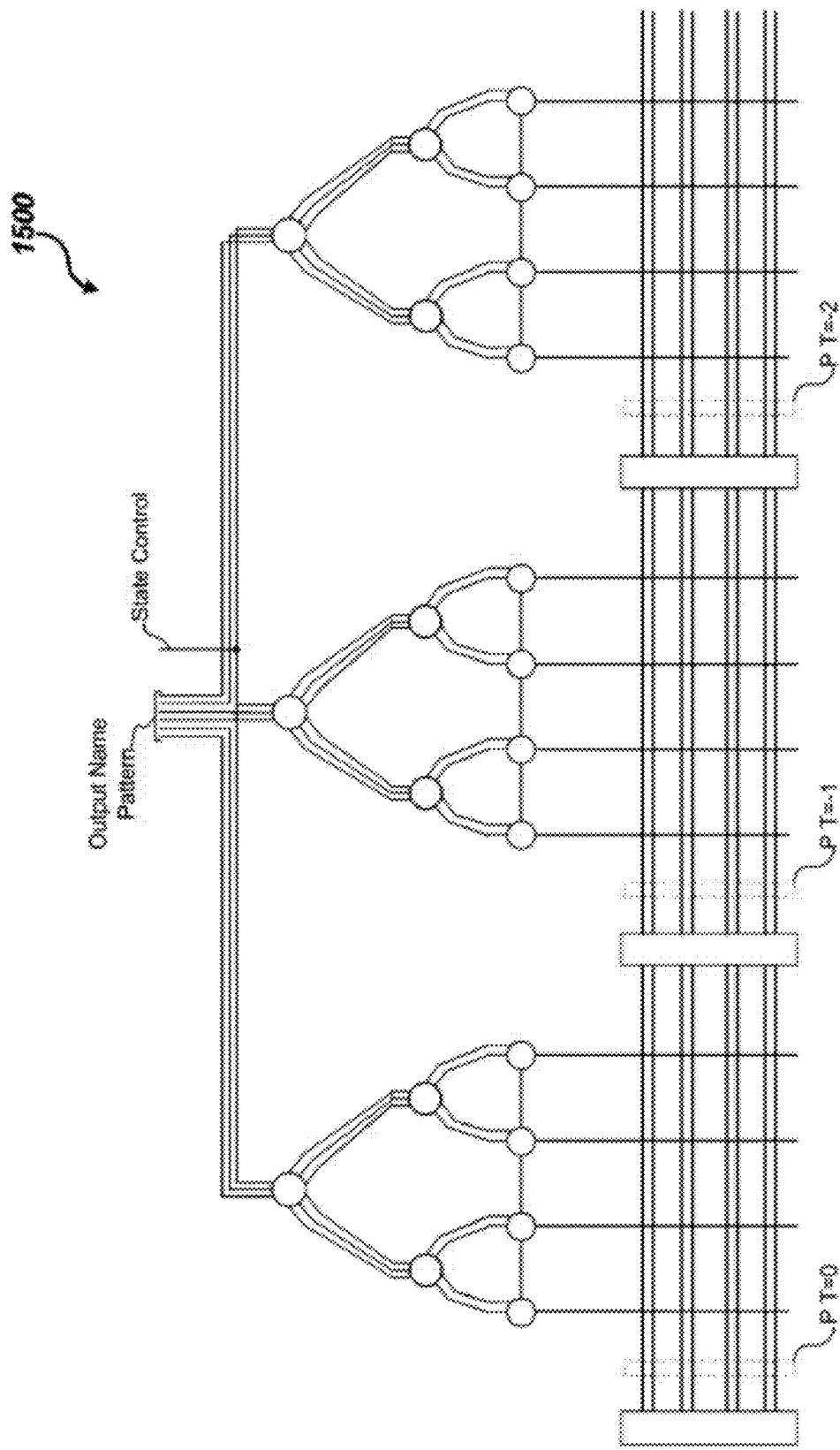
FIG. 15 illustrates a Meta-KCAM system, which can be implemented in accordance with an embodiment.

As indicated by the system 1500 depicted in FIG. 15, constructing a circuit capable of remembering uncommon sequences is relatively straightforward and requires combining individual KCAM modules together, where each KCAM module receives a portion of the pattern. FIG. 15 illustrates the case of each KCAM operating on portions of a sequence. It is of course not required that the KCAM operate on a sequence, as this basic configuration could just as easily be configured for spatial patterns. We will refer to an individual KCAM and KRAM as Base Units. Note that a data rate and synaptic learning and decay rates will determine the largest attainable size of the Base Unit.

If a KHTM module must use two KCAM's to form stable name patterns, then it must also have multiple KRAM's to handle the top-town predictions. For example, consider two KHTM modules, A and B, and a third module C that is the parent to A and B. If A and B both must use 2 KCAM memories to form stable name patterns, then C must use 4 KCAM modules to form stable name pattern of the combination of A and B. If C uses 4 KCAM modules then it follows that the children, A and B, must have 4 KRAM modules. This can be represented visually in FIG. 16, which illustrates a module wiring scheme or system 1600 for a sample Meta-KHTM system, such as, for example system 1500 depicted in FIG. 15.

Figure 16:
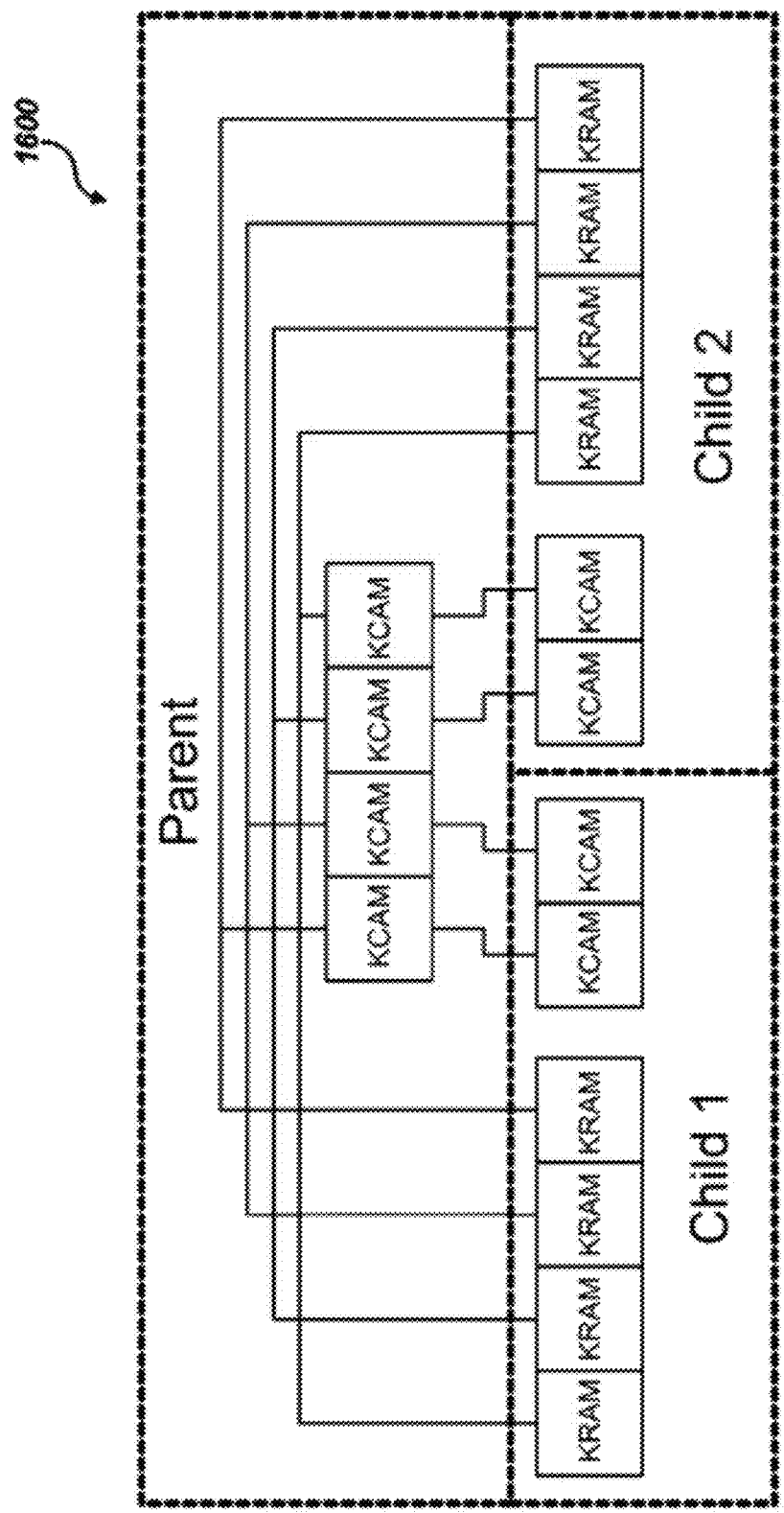
FIG. 16 illustrates a module wiring scheme for a sample Meta-KHTM system, which can be implemented in accordance with an embodiment.

It is not immediately clear that the wiring pattern shown in FIG. 16 is capable of scaling on a 2D surface. However, recall that it is a hierarchical structure, which implies that it can be mapped to a 2D surface and scaled. Before the layout can be discussed, we must briefly explain how the modules in a KHTM utilize the metal layers in a lithography process. This can be seen in the system 1700 of FIG. 17.

Figure 17:
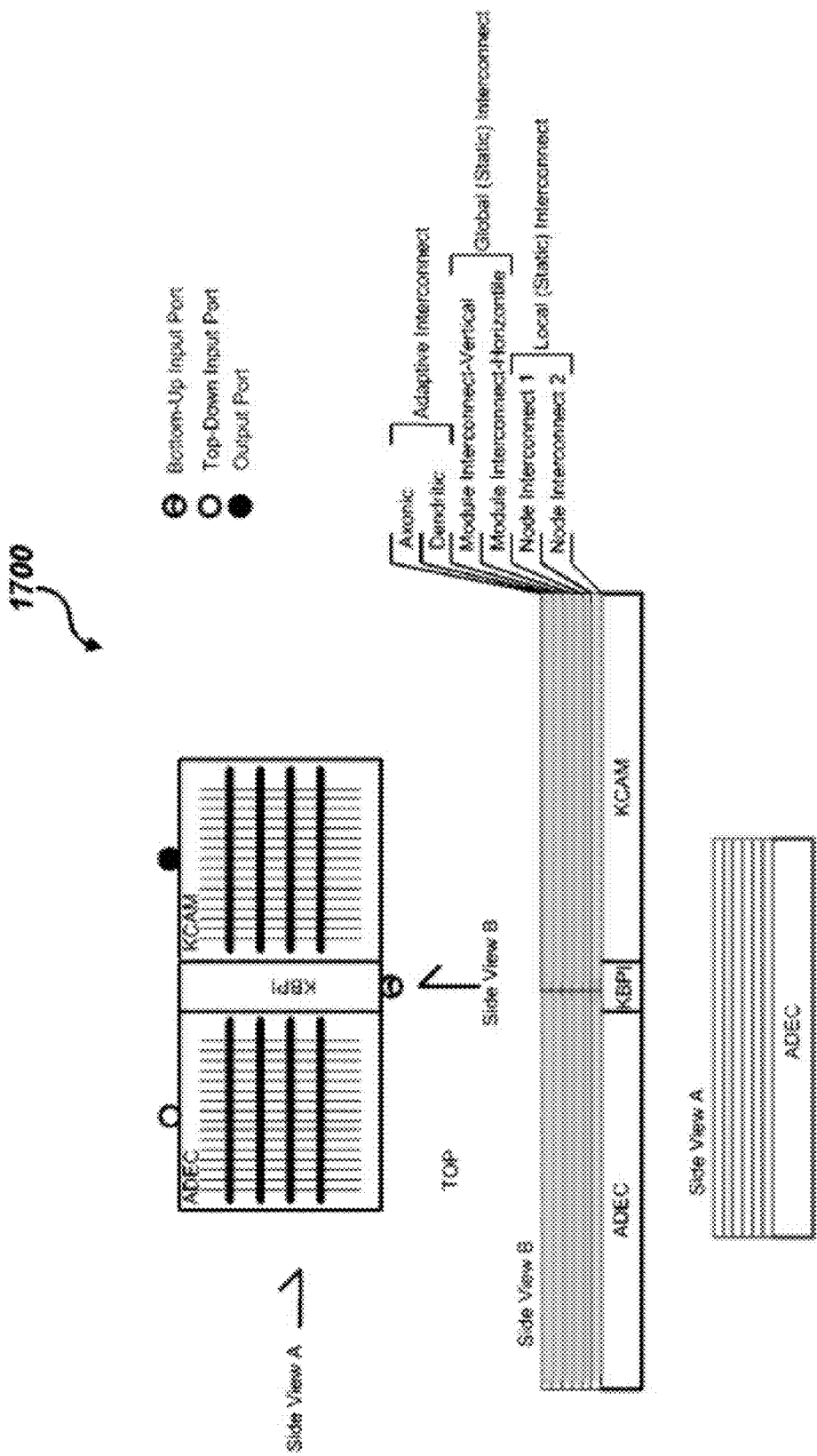
FIG. 17 illustrates a possible use of metal layers in a modern electronics fabrication framework, which can be implemented in accordance with an embodiment.

Note that in the configuration of system 1700 depicted in FIG. 17, six metal layers may be utilized. Metal layers 5 and 6, labeled Axonic and Dendritic in FIG. 17, are used for the electrodes that "sandwich" adaptive interconnects. These adaptive interconnects may be composed of arrays of any type of meta-stable switches. Metal Layers 3 and 4 may be used for KHTM module interconnect and Metal Layers 1 and 2 for inter-nodal wiring. We may now discuss how a hierarchical assembly of Base Units may be mapped to a 2D chip surface with 6 metal layers and scaled indefinitely. We must first detail how the component modules of the hierarchy scale at each hierarchical level.

As one can see, for every increase in the hierarchical level there are twice as many base units. Additionally, for every KCAM module there are two KRAM modules. This of course is the result of the binary hierarchical structure. A 3-branching hierarchical structure would contain 3 times as many KRAMs and KCAMs. For example, see system 1800 of FIG. 18. Notice from the configuration of system 1800 of FIG. 18 that the total space required for neural nodes, in proportion to the area needed for synapses, decreases for every generation. Stated in another manner, the total synaptic activation resulting from connections within the modules of the KHTM increases relative to the connections from lower-level modules.

Figure 18:
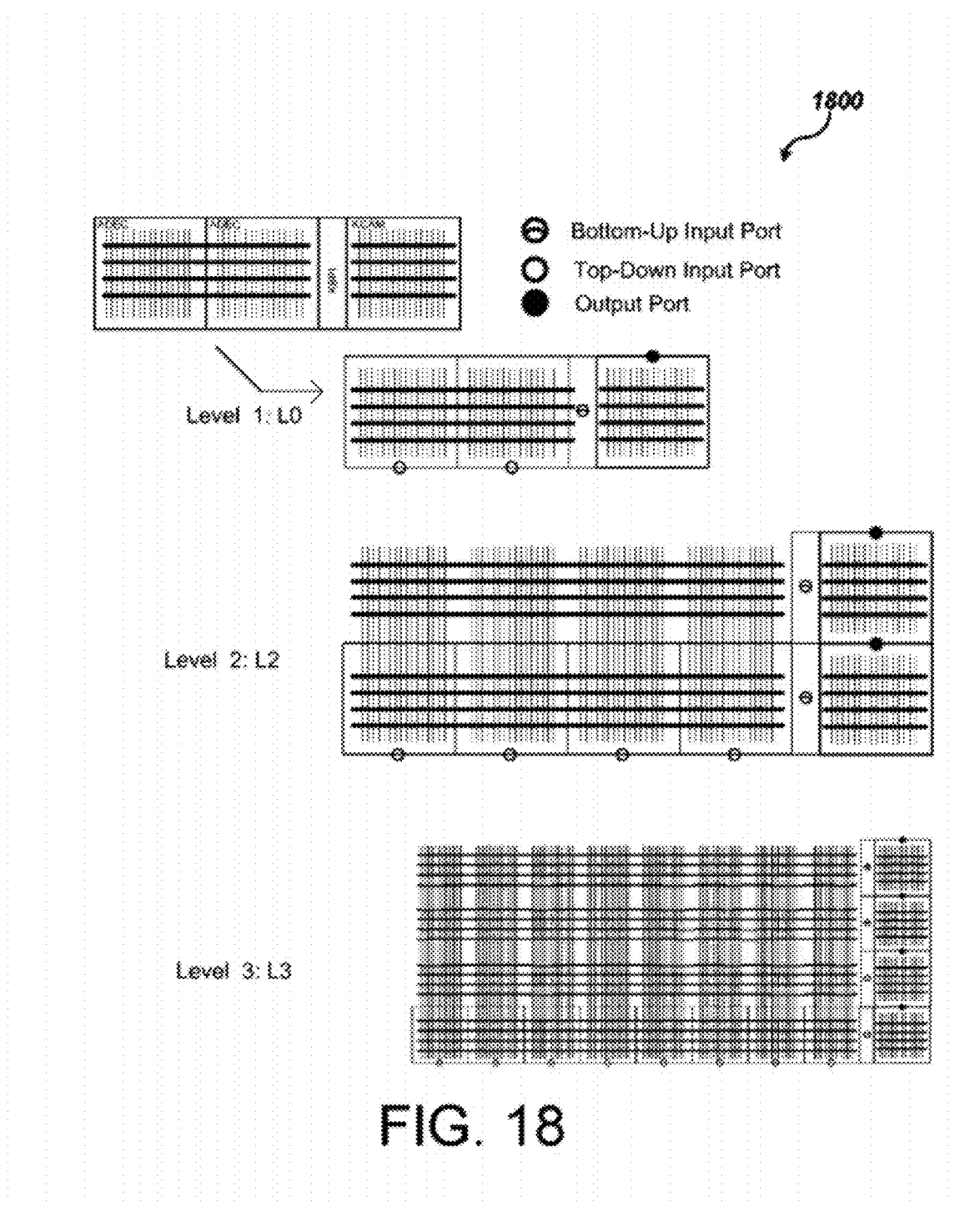
FIG. 18 illustrates a scaling pattern for modules at various levels in a Meta-KHTM hierarchy, which can be implemented in accordance with an embodiment.

We are now in a position to detail how a KHTM composed of the levels shown in system 1800 of FIG. 18, which are further composed of the Base Unit KRAM and KCAM modules, may be wired on a 2D surface. This can be seen in system 1900 of FIG. 19. Note that the synaptic wiring layers have been removed for clarity.

Figure 19:
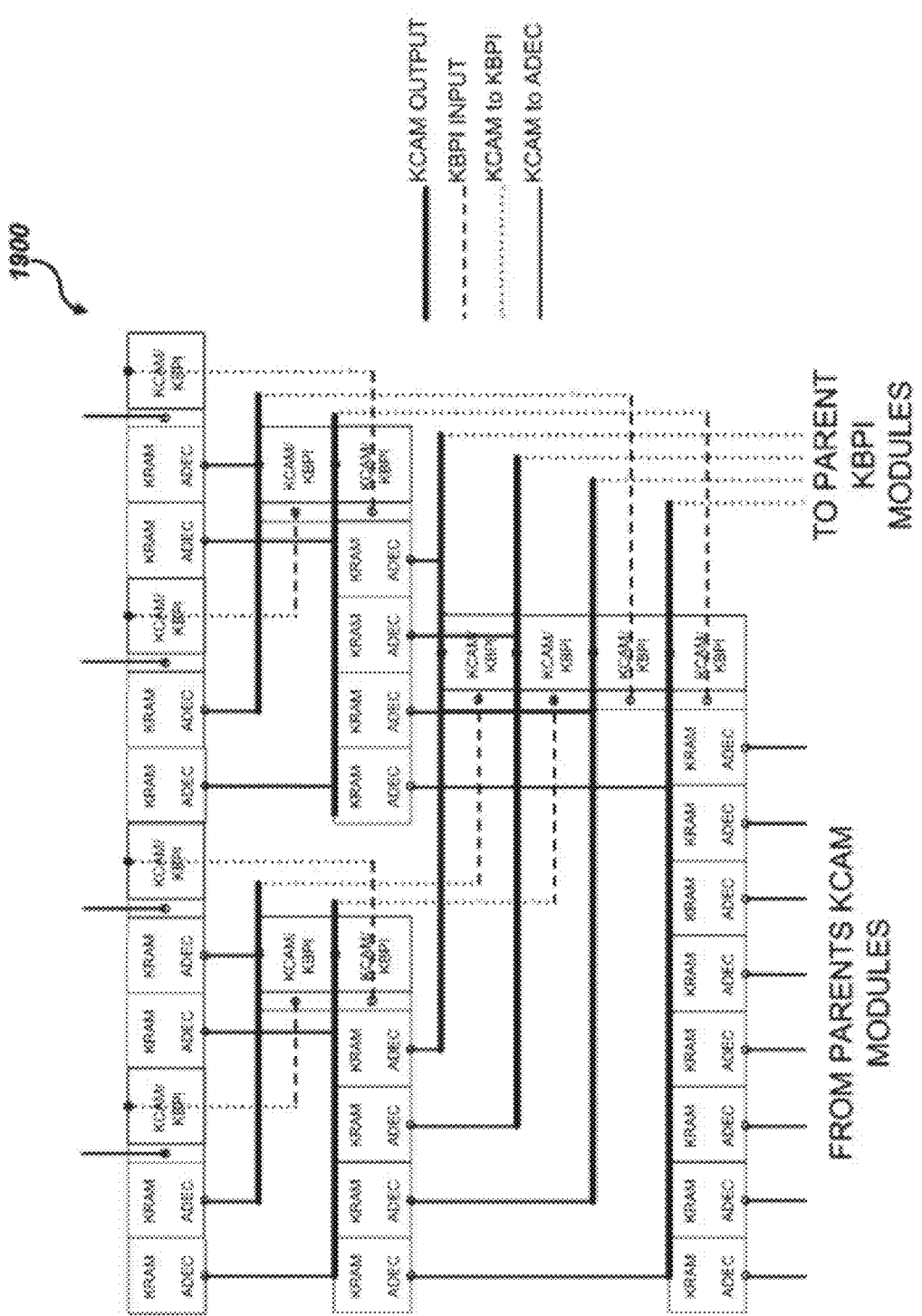
FIG. 19 illustrates a wiring scheme for a Meta-KHTM system compatible with modern electronics fabrication, which can be implemented in accordance with an embodiment.

FIG. 19 demonstrates how Base Units may be interconnected with only two metal layers, thanks to the orderly hierarchical scaling properties of the Base Units. Note that any branching pattern other than binary may also be configured in the manner shown in FIG. 19. Also note that the wiring pattern may be scaled indefinitely, subject only to the total chip surface area. We refer to the hierarchical assembly of Base Units as "Meta-KHTM".

Recall that the purpose of Meta-KHTM is to form a continuing hierarchical representation while allowing for the learning and memory recall of uncommon patterns that are composed of a statistically frequently-occurring pattern base-set. The total KHTM system is thus composed of a large number of Base Units, where each Base Unit learns to recognize and predict frequently occurring base patterns. These patterns are combined by upper levels of the hierarchy to form higher-level representations, which gradually condense large quantities of data into an "object representation".

Stated another way, a large KHTM system could be used to translate 5 mega pixels into ten-thousand words, where each word represents an object found within the picture and each word is composed of a set of base-patterns (i.e. letters). To continue the hierarchical organization past the point of an object-representation, if the objects do not occur at a frequency necessary for synaptic repair, it is necessary for the basic hierarchical structure of the KHTM to undergo a structural phase change. Below this phase change we term KHTM, whereas above the phase change we term Meta-KHTM. This can be seen more clearly in system 2000 of FIG. 20.

Figure 20:
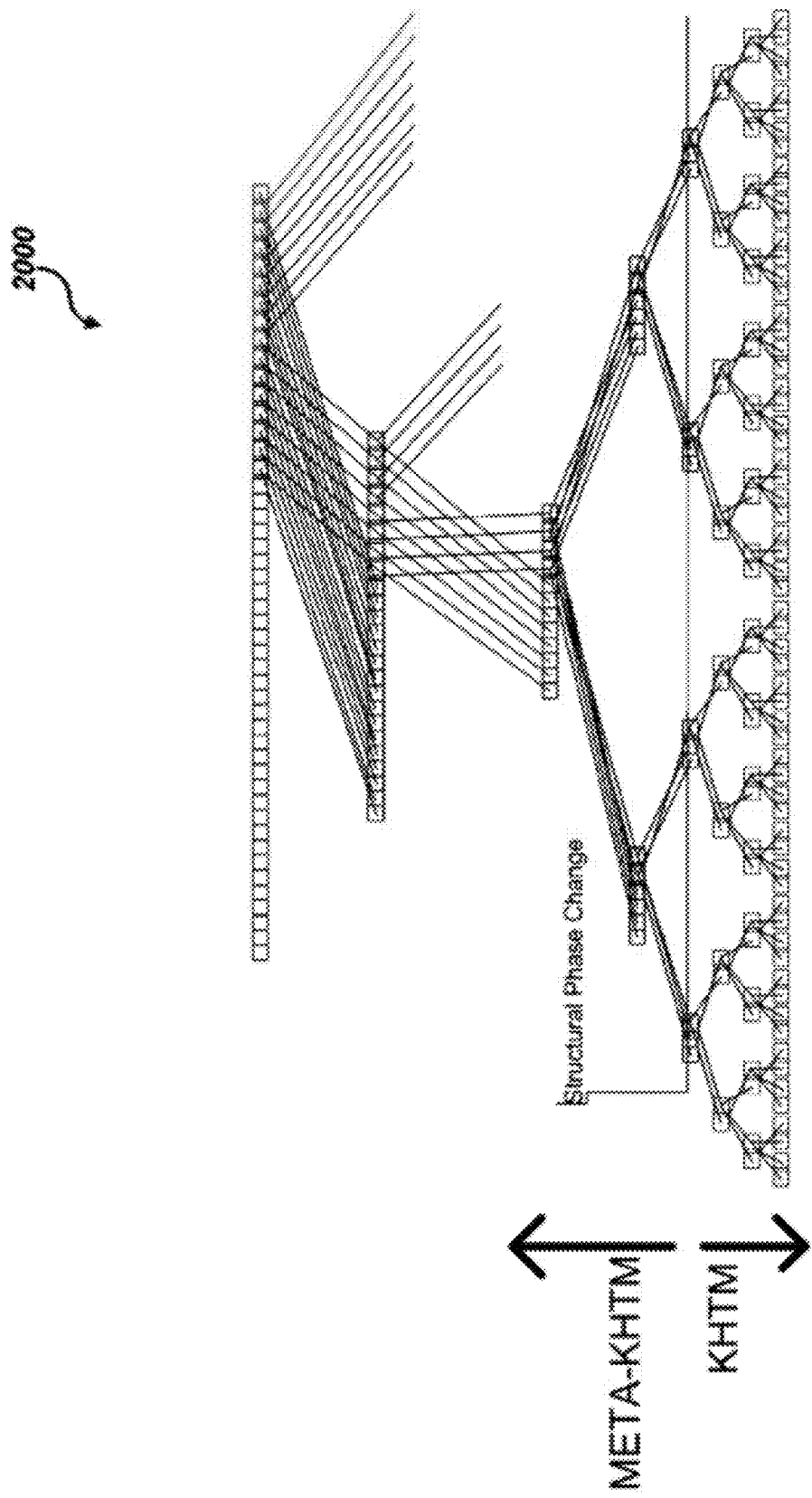
FIG. 20 illustrates a structural phase change between KHTM and meta-KHTM, which can be implemented in accordance with an embodiment.

Note that the manner in which modules are connected between the phase change layers could differ from that shown in system 20 of FIG. 20. If one termed the KHTM module layers −L3,−L2,−L1, the phase-change layer as L0, and the remaining Meta-KHTM layers L1,L2, etc, then it is certainly possible and desirable for modules from any layer below the phase change layer to connect to the phase-change layer. For example, modules from −L2 and −L1 could connect to the L0 layer.

Active Gating

At this point it should be clear how a module can over-ride a recognition with a prediction by modulation of the Dopa parameter. When such an override occurs, information is necessarily flowing down the hierarchy. If, for example, all modules in a KHTM hierarchy had elevated Dopa parameters so that all modules provided recognition overrides, then the uppermost-module would retain control over the KHTM output. A mechanism for activity regulating the Dopa parameter could allow for rapid gating of the KHTM system. That is, at any point in time control of the KHTM is given to a module within the hierarchy that can best predict the KHTM's future state. This can be accomplished by a top-top configuration signal that compares the Confidence of each module and regulates its Dopa parameter in response to this signal. This process can be most readily described in pseudo-code, but it will be apparent that such a mechanism is easily accomplished with traditional electronics methodologies.

1) For all modules in the KHTM hierarchy, starting from the lowest level and moving to the highest level modules:
   Create a variable local to each module that represents the modules current Confidence. Call this variable the "Confidence Buffer".
2) For all modules in the KHTM hierarchy, starting from the highest level module and moving to the lowest-level modules, compare the modules Confidence Buffer to its parent module's Confidence Buffer.
   If it is greater, add a set amount to the Dopa parameter and make the modules Confidence Buffer equal to its parents
   If it is lower, subtract a set amount from the Dopa parameter or do nothing. Continue until the lowest level module is reached
3) Repeat Thus, the Dopa parameter may be written as:

$$D = \alpha D_1 + \beta D_2 + \gamma D_3$$

where $D_1$ and $D_2$ have been previously discussed and $D_3$ is controlled via a dynamic gating mechanism detailed above. For example, the used of "bucket brigade" for analog voltage transfer, such as is used in digital cameras, is one such mechanism for transfer of a confidence buffer signal down through the hierarchy. It should be appreciated that this function may be attained in a number of ways while providing for the same teaches set forth herein. The result of the previous pseudo-code is straightforward: only the most-confidence module may propagate a prediction down through the hierarchy at any moment in time. The rate at which the KHTM system may dynamically move control between modules is a function of the rate at which the Confidence of a module may change, which is controlled by the persistence factor.

On can now appreciate the basic working of the KHTM system. If a lower-level module fails to predict its future state then it Confidence will drop. If this happens, it becomes incapable of over-riding recognitions with predictions and passes the un-compromised recognition pattern to its parent. If its parent also cannot prediction its future state, then its Confidence will also drop and will passed the uncompromised recognition pattern to its parent. This will continue until a module is able to predict its future state and maintain an elevated confidence. At this point, a higher-level module may assume control of the hierarchy via the gating mechanisms described.

Based on the forgoing and referenced patents it should be clear to one skilled in the art how the problems of connectivity, communication power and adaptability may be overcome to construct a biological-scale statistical learning memory system utilizing modern 2D fabrication technology and meta-stable switches.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The embodiment of an invention in which an exclusive property or right is claimed are defined as follows:

1. A method for a hierarchical temporal memory, comprising:
   providing a hierarchical temporal memory comprising a plurality of modules; and
   permitting at least one module among said plurality of modules to override in said hierarchical temporal memory, a recognition with a prediction by a modulation of a Dopa parameter, such that when an override thereof occurs, data flows down said hierarchical temporal memory; and
   arranging an uppermost module among said plurality of modules to retain control over at least one output from said hierarchical temporal memory, if all modules among said plurality of modules in said hierarchical temporary memory have elevated Dopa parameters so that all of said modules provide recognition overrides.

2. The method of claim 1 further comprising actively regulating control over at least one output of said hierarchical temporal memory to allow for a rapid gating of said hierarchical temporal memory, wherein at any point in time, control of said hierarchical temporal memory is provided to at least one module that can best predict a future state of said hierarchical temporal memory.

3. The method of claim 1 further comprising providing a top-top configuration signal that compares a confidence of each module among said plurality of modules and regulates respective Dopa parameters thereof in respond to said top-top configuration signal.

4. The method of claim 3 wherein said top-top configuration signal for comparing said confidence and regulating said Dopa parameters of each module among said plurality of modules is accomplished via a pseudo code.

5. The method claim 3 wherein said top-top configuration signal for comparing said confidence and regulating said Dopa parameters of each module among said plurality of modules is accomplished electronically.

6. The method of claim 1 further comprising for all modules among said plurality of modules in said hierarchical temporal memory, starting from a lowest level module and moving to a highest level module thereof, creating a variable local to each module among said plurality of modules that represents a current confidence of said module and designating said variable as a confidence buffer.

7. The method of claim 6 further comprising for all modules among said plurality of modules in said hierarchical temporal memory, starting from sad lowest level module and moving to said highest level module thereof, comparing said confidence buffer to a confidence buffer of respective parent module thereof.

8. The method of claim 7 further comprising if said confidence buffer is greater than said confidence buffer of said respective parent module thereof, adding a set amount to said Dopa parameter and designating said at least one module among said plurality of modules as equal to at least one respective parent module thereof.

9. The method of claim 7 further comprising if said confidence buffer is lower than said confidence buffer of said respective parent module thereof, subtracting a set among from said Dopa parameter or taking no activity.

10. The method of claim 7 further comprising continuing until a lowest level module among said plurality of modules is attained.

11. The method of claim 1 further comprising configuring said Dopa parameter to be expressed mathematically as $D=\alpha D_1+\beta D_2+\gamma D_3$, where $D_3$ is controlled via dynamic gating.

12. A system for a hierarchical temporary memory, said system comprising:

at least one arbitrary hierarchical structure mapped for a two-dimensional layout in order to provide for said hierarchical temporal memory;

a memory for storing pattern probabilities, wherein said pattern probabilities are fed up and down said hierarchical temporal memory;

a flip-lock component that generates a flip-lock cycle for providing anti-Hebbian learning and wherein said flip-lock component further generates a flip-lock cycle for providing Hebbian learning, in combination with weight decay;

a router hierarchy for generating at least one feedback signal to control said Hebbian learning and said anti Hebbian learning;

a critical period during which all neural nodes in an ensemble in said hierarchical temporal memory receive a synaptic update; and an active period during which all neural nodes in said router hierarchy compete for a Hebbian update; and a subsystem for prediction override regulation.

13. The system of claim 12 further comprising a regulator for regulating said prediction override regulation via a Dopa parameter, wherein a decay period is utilized for synaptic renormalization.

14. The system of claim 13 wherein said Dopa parameter is regulated by a global rule and a local rule.

15. The system of claim 13 wherein said Dopa parameter is regulated based on proportion to a temporal derivative of a confidence.

16. The system of claim 12 wherein a prediction magnitude is measured by post-synaptic current activation.

17. The system of claim 12 wherein a prediction magnitude is measured by synchronous firing of neurons among said neural nodes of said system.

18. The system of claim 12 wherein a confidence threshold is regulated by adaptively accumulating expectations.

19. The system of claim 13 wherein a prediction magnitude is increased in an amount proportional to said Dopa parameter.

20. A system for hierarchical temporal memory, said system comprising:

a hierarchical temporal memory comprising a plurality of modules; and at least one module among said plurality of modules that overrides in said hierarchical temporal memory, a recognition with a prediction by a modulation of a Dopa parameter, such that when an override thereof occurs, data flows down said hierarchical temporal memory; and a regulator for actively regulating control over at least one output of said hierarchical temporal memory to allow for a rapid gating of said hierarchical temporal memory, wherein at any point in time, control of said hierarchical temporal memory is provided to at least one module that can best predict a future state of said hierarchical temporal memory.

* * * * *